US012804894B2

(12) United States Patent
Kim et al.

(10) Patent No.: US 12,804,894 B2
(45) Date of Patent: Nov. 17, 2026

(54) SEMICONDUCTOR DEVICE INCLUDING A PERIPHERAL CIRCUIT DEVICE

(71) Applicant: SAMSUNG ELECTRONICS CO., LTD., Suwon-si (KR)

(72) Inventors: Seunghwan Kim, Suwon-si (KR); Sungho Jang, Suwon-si (KR); Jiseok Kwon, Suwon-si (KR); Haein Jung, Suwon-si (KR); Seungho Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 391 days.

(21) Appl. No.: 18/391,804

(22) Filed: Dec. 21, 2023

(65) Prior Publication Data

US 2024/0268105 A1 Aug. 8, 2024

(30) Foreign Application Priority Data

Feb. 8, 2023 (KR) ........................ 10-2023-0017032

(51) Int. Cl.
*H10B 12/00* (2023.01)

(52) U.S. Cl.
CPC ........... *H10B 12/50* (2023.02); *H10B 12/315* (2023.02)

(58) Field of Classification Search
None
See application file for complete search history.

(56) References Cited

U.S. PATENT DOCUMENTS 8,471,343 B2 6/2013 Doris et al.
8,871,624 B2 10/2014 Horak et al.
9,425,280 B2 8/2016 Cai et al.
11,201,228 B2 12/2021 Lee et al.
2022/0262731 A1* 8/2022 Park .................... H10D 64/664
2023/0328960 A1* 10/2023 Kim .................... H10B 12/315

FOREIGN PATENT DOCUMENTS

CN 110071046 7/2019
CN 111900163 11/2020

* cited by examiner

*Primary Examiner* — Jay C Chang
(74) *Attorney, Agent, or Firm* — Morgan, Lewis & Bockius LLP

(57) ABSTRACT

A semiconductor device includes: a substrate including a cell region and a peripheral circuit region; an active region; a cell word line extending across the active region in a first horizontal direction within the cell region; a cell bit line extending in a second horizontal crossing the first horizontal direction in the cell region; a peripheral circuit gate structure extending in the second horizontal direction on the substrate; a peripheral circuit spacer structure disposed on a sidewall of the peripheral circuit gate structure; a peripheral circuit etch stop layer disposed on the substrate, and separated from the peripheral circuit gate structure and the peripheral circuit spacer structure; and a peripheral circuit contact connected to the substrate by penetrating the peripheral circuit etch stop layer. The peripheral circuit etch stop layer has an end portion positioned between the peripheral circuit contact and the peripheral circuit spacer structure.

20 Claims, 20 Drawing Sheets

SEMICONDUCTOR DEVICE INCLUDING A PERIPHERAL CIRCUIT DEVICE

CROSS-REFERENCE TO RELATED APPLICATION

This application claims priority under 35 U.S.C. § 119 to Korean Patent Application No. 10-2023-0017032, filed on Feb. 8, 2023, in the Korean Intellectual Property Office, the disclosure of which is incorporated by reference herein in its entirety.

TECHNICAL FIELD

Embodiments of the present inventive concept relate to a semiconductor device, and more particularly, to a semiconductor device including a peripheral circuit device.

DISCUSSION OF THE RELATED ART

Electronic devices are under development to be more compact and lightweight to meet the demand of the rapid development of the electronic industry and desires of users. Accordingly, semiconductor devices with a high degree of integration are desired to be used in electronic devices, and design rules for configurations of semiconductor devices are reduced.

SUMMARY

According to an embodiment of the present inventive concept, a semiconductor device includes: a substrate including a cell region and a peripheral circuit region; an active region defined by a device isolation layer in the substrate in the cell region; a cell word line extending across the active region in a first horizontal direction within the substrate in the cell region; a cell bit line extending in a second horizontal crossing the first horizontal direction on the substrate in the cell region; a peripheral circuit gate structure extending in the second horizontal direction on the substrate in the peripheral circuit region; a peripheral circuit spacer structure disposed on a sidewall of the peripheral circuit gate structure; a peripheral circuit etch stop layer disposed on the substrate in the peripheral circuit region, and separated from the peripheral circuit gate structure and the peripheral circuit spacer structure; and a peripheral circuit contact connected to the peripheral circuit region of the substrate by penetrating the peripheral circuit etch stop layer in a vertical direction, wherein the peripheral circuit spacer structure includes nitride, and the peripheral circuit etch stop layer has an end portion positioned between the peripheral circuit contact and the peripheral circuit spacer structure.

According to an embodiment of the present inventive concept, a semiconductor device includes: a substrate including a cell region and a peripheral circuit region; an active region defined by a device isolation layer in the substrate in the cell region; a cell word line extending across the active region in a first horizontal direction within the substrate in the cell region; a cell bit line extending in a second horizontal crossing the first horizontal direction on the substrate in the cell region; a peripheral circuit gate structure extending in the second horizontal direction on the substrate in the peripheral circuit region; a peripheral circuit offset layer arranged on a sidewall of the peripheral circuit gate structure and including nitride; a peripheral circuit etch stop layer arranged on the substrate in the peripheral circuit region, and separated from the peripheral circuit offset layer with a peripheral circuit interlayer insulating layer disposed between the peripheral circuit etch stop layer and the peripheral circuit offset layer, wherein the peripheral circuit etch stop layer includes nitride; and a peripheral circuit contact connected to the peripheral circuit region of the substrate by penetrating the peripheral circuit interlayer insulating layer and the peripheral circuit etch stop layer in a vertical direction.

According to an embodiment of the present inventive concept, a semiconductor device includes: a substrate including a first region and a second region; an active region defined by a device isolation layer in the substrate in the first region; a cell word line extending across the active region in a first horizontal direction within the substrate in the first region; a cell bit line extending in a second horizontal crossing the first horizontal direction on the substrate in the first region; a peripheral circuit gate structure extending in the second horizontal direction on the substrate in the second region; a peripheral circuit spacer structure arranged on a sidewall of the peripheral circuit gate structure and including a peripheral circuit offset layer, which includes silicon nitride, and a peripheral circuit spacer that is separated from the peripheral circuit gate structure with the peripheral circuit offset layer disposed between peripheral circuit spacer and the peripheral circuit gate structure and includes silicon oxide; a peripheral circuit etch stop layer arranged on the substrate in the second region, and separated from the peripheral circuit offset layer with a peripheral circuit interlayer insulating layer disposed between the peripheral circuit etch stop layer and the peripheral circuit offset layer, wherein the peripheral circuit etch stop layer includes silicon nitride; a peripheral circuit contact connected to the substrate in the second region by penetrating the peripheral circuit interlayer insulating layer and the peripheral circuit etch stop layer in a vertical direction; and a peripheral circuit top spacer insulating layer arranged on an upper surface of the peripheral circuit offset layer and including nitride, wherein a side surface of the peripheral circuit offset layer includes a portion that does not overlap with the peripheral circuit top spacer insulating layer in the first horizontal direction.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, embodiments of the present inventive concept are described in detail with reference to the accompanying drawings.

Figure 1:
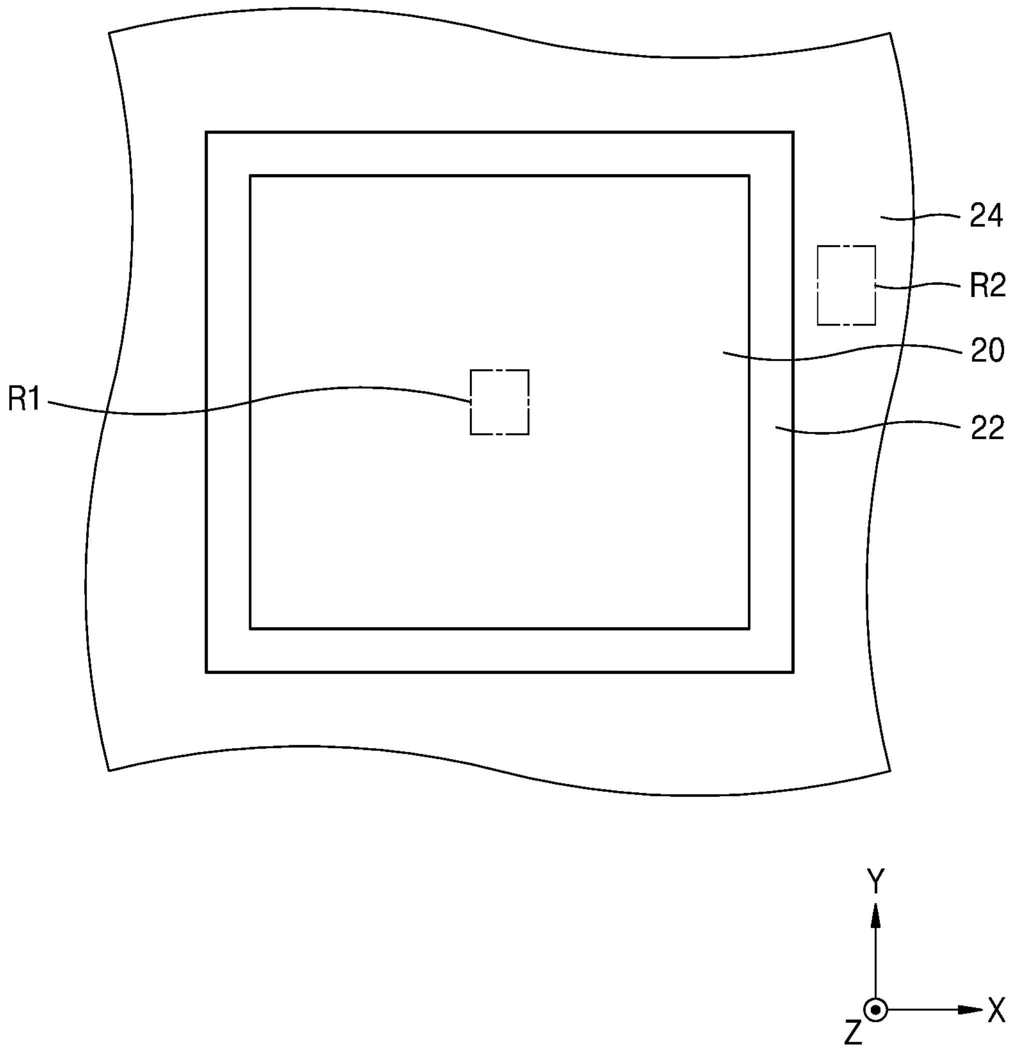
FIG. 1 is a schematic layout diagram of a semiconductor device according to an embodiment of the present inventive concept.

FIG. 1 is a schematic layout diagram of a semiconductor device according to an embodiment of the present inventive concept.

Referring to FIG. 1, a semiconductor device according to an embodiment of the present inventive concept may include a cell region 20, a connection region 22, and a peripheral circuit region 24. The connection region 22 may be formed along the circumference of the cell region 20. The connection region 22 may be formed between the cell region 20 and the peripheral circuit region 24 and may separate the cell region 20 from the peripheral circuit region 24. The peripheral circuit region 24 may be provided around the cell region 20.

Figure 2:
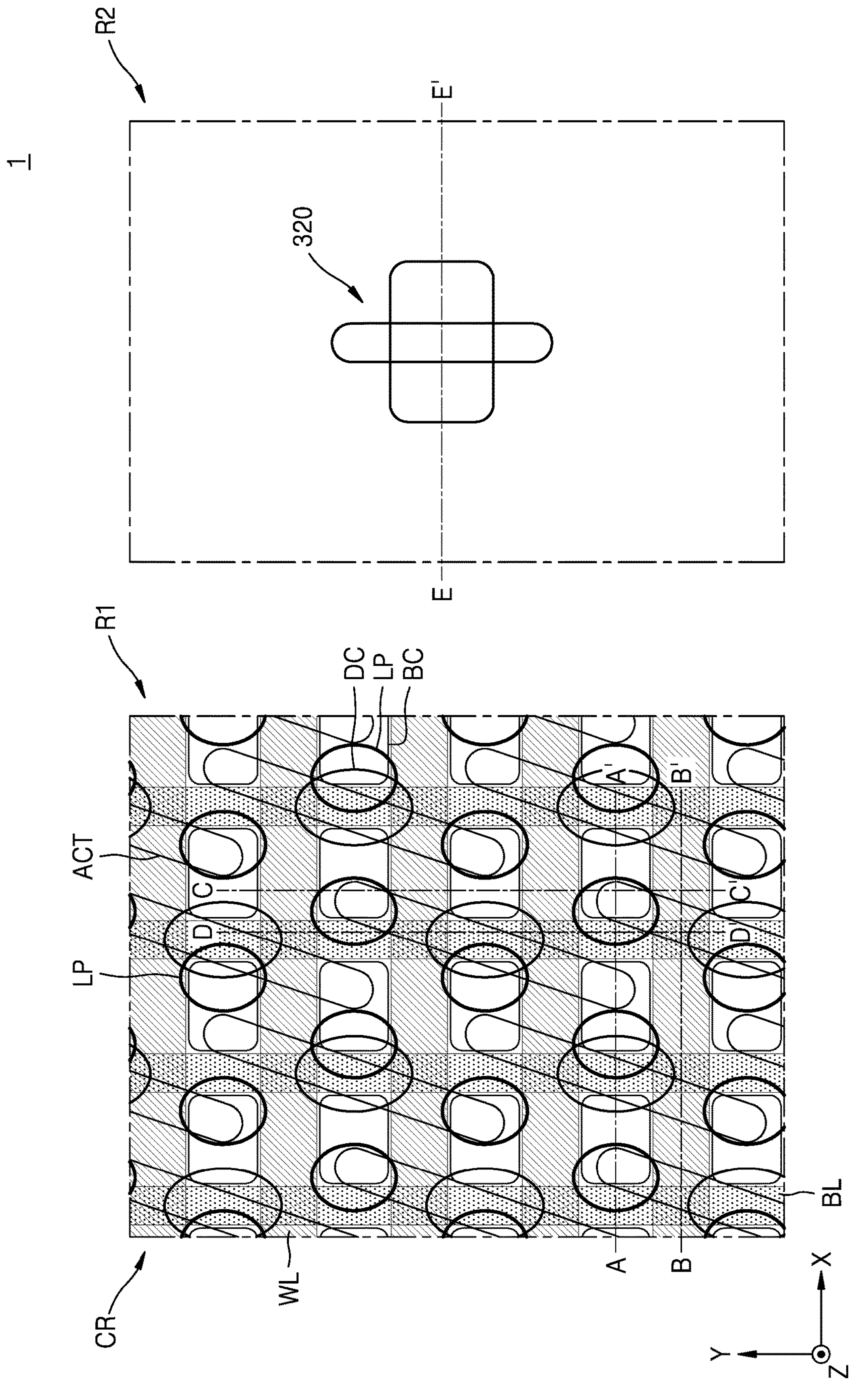
FIG. 2 is a schematic layout diagram of regions R1 and R2 of FIG. 1.
Figure 3A:
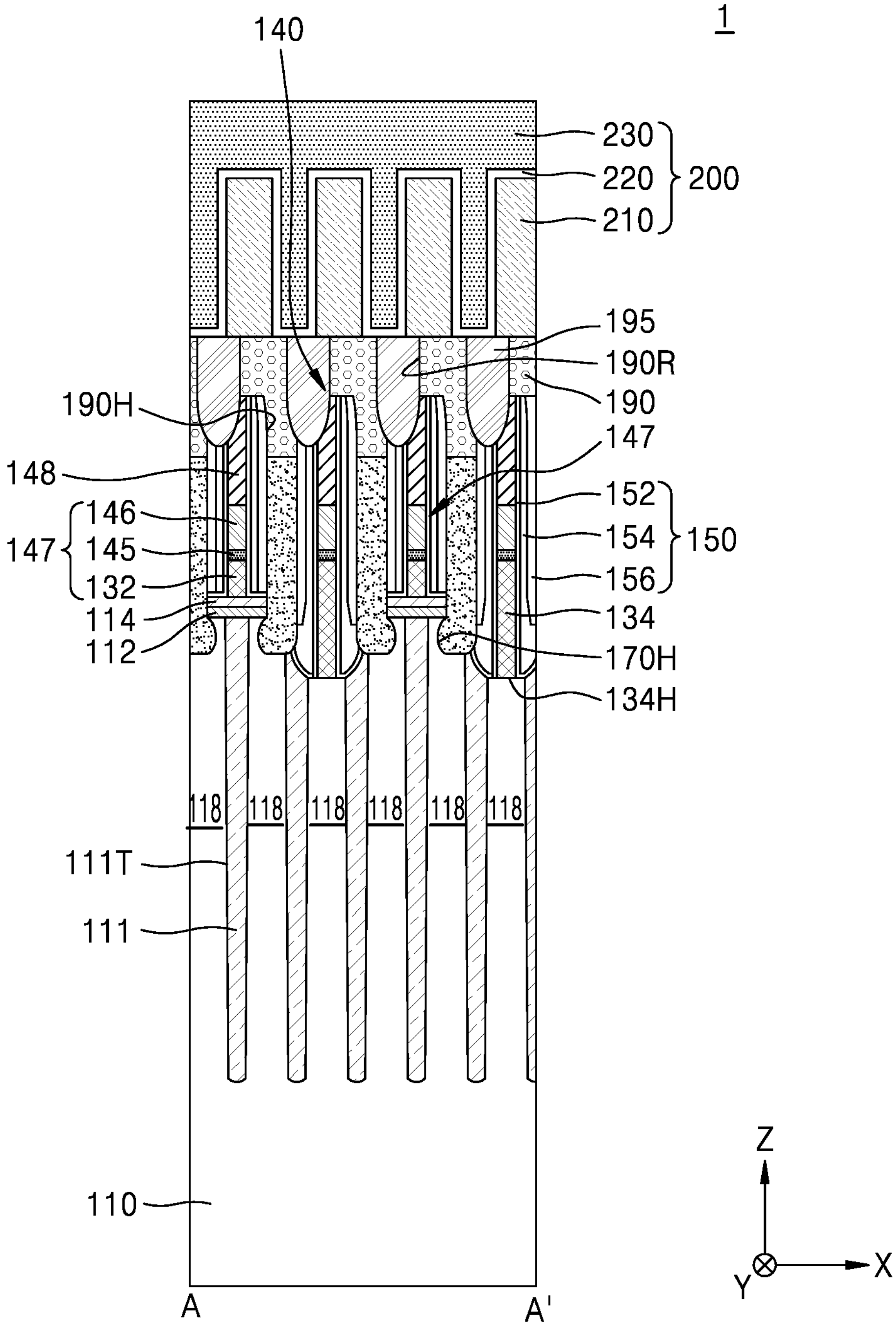
FIGS. 3A, 3B, 3C, and 3D are cross-sectional views taken along lines A-A', B-B', C-C', and D-D' of FIG. 2.
Figure 3B:
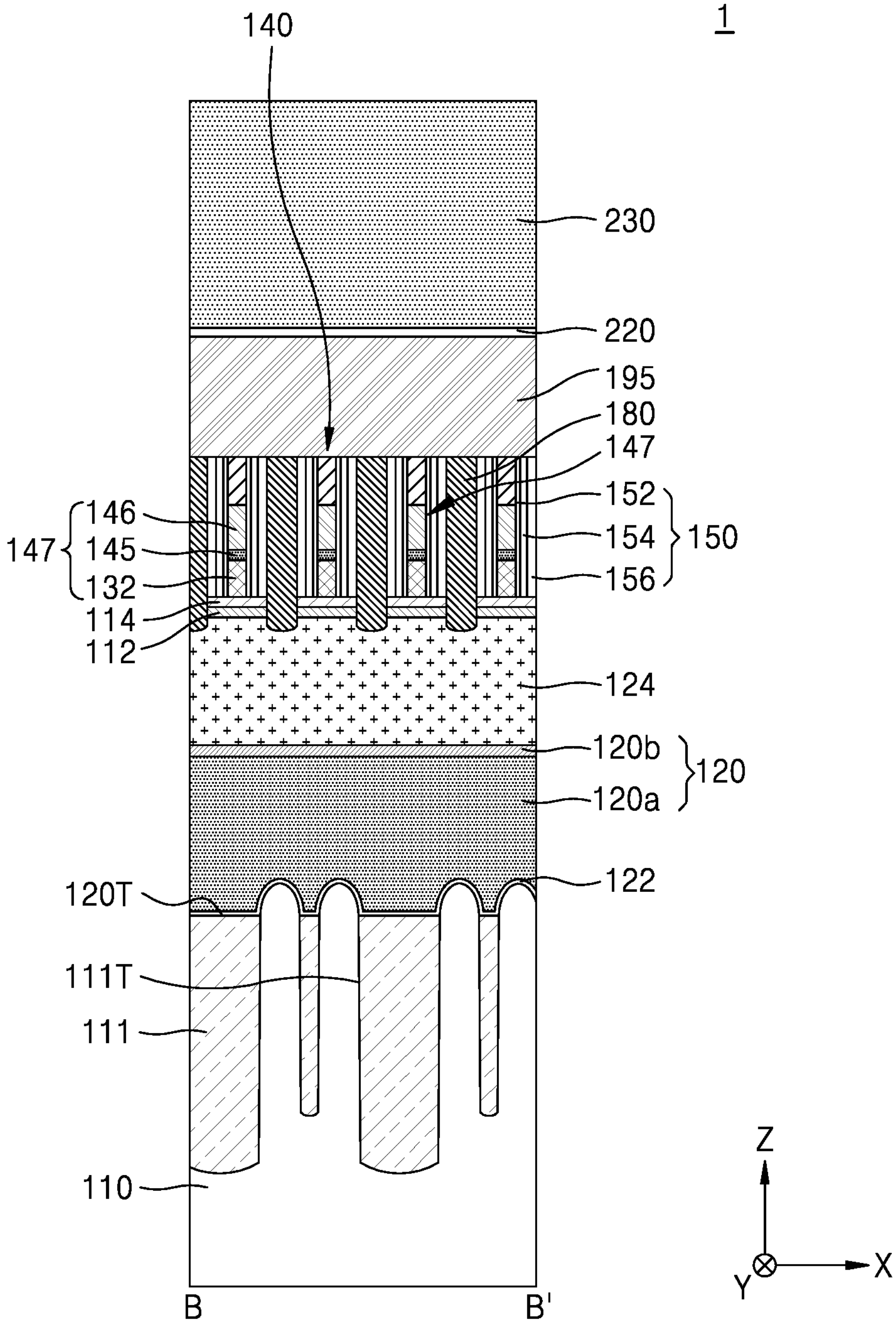
Figure 3C:
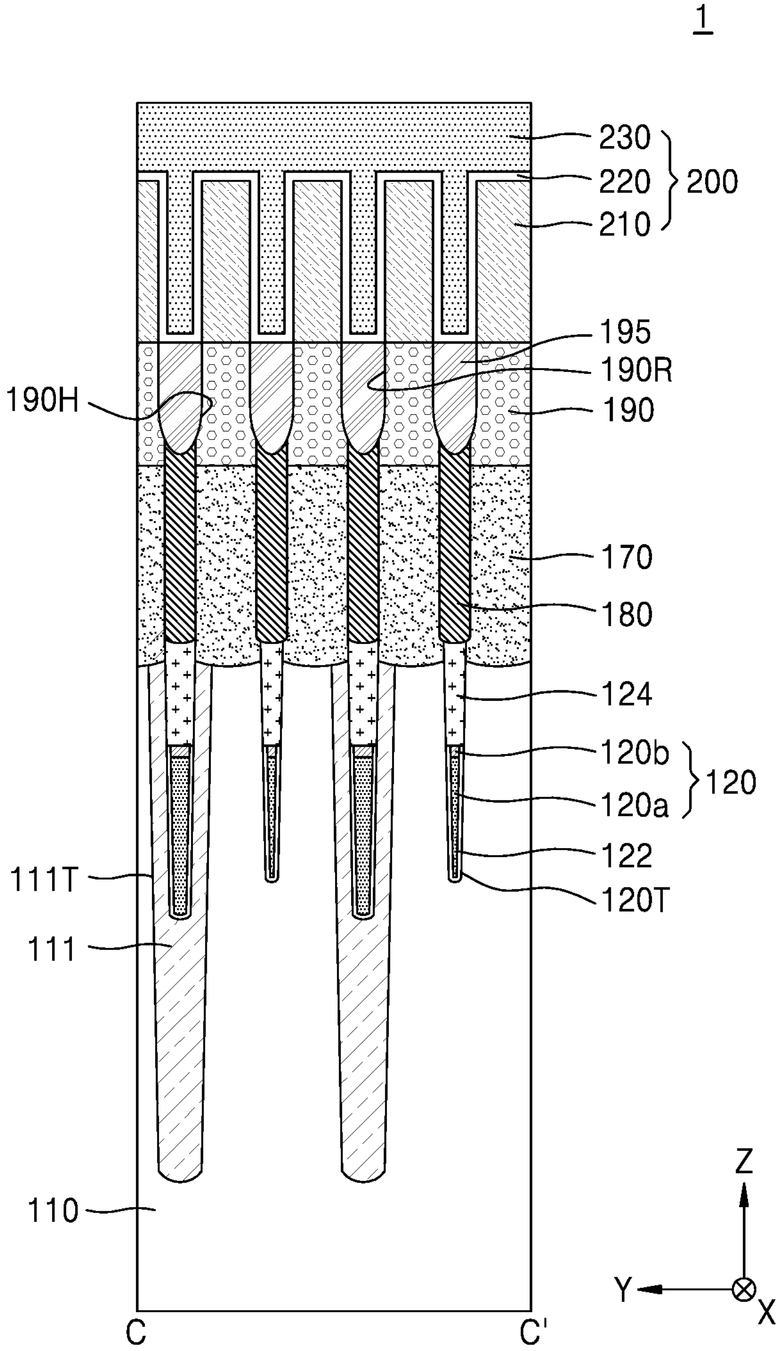
Figure 3D:
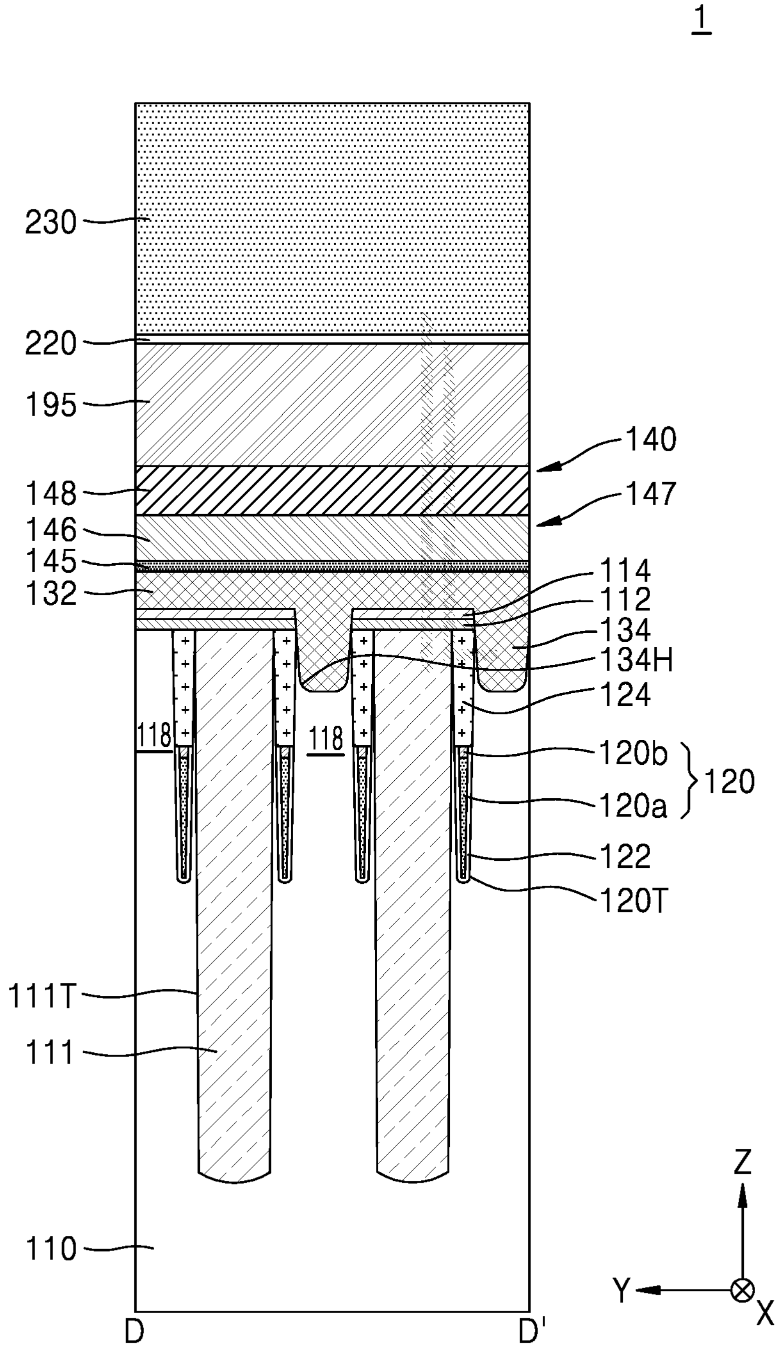

FIG. 2 is a schematic layout diagram of a region R1 of FIG. 1, which illustrates main components of a semiconductor device according to an embodiment of the present inventive concept. FIGS. 3A to 3D are cross-sectional views taken along lines A-A', B-B', C-C', and D-D' of FIG. 2.

Referring to FIG. 2, a semiconductor device 1 may include a plurality of active regions ACT formed in the memory cell region CR. The memory cell region CR may correspond to the cell region 20 of FIG. 1. In some embodiments of the present inventive concept, the plurality of active regions ACT in the memory cell region CR may be arranged to have long axes in an oblique direction with respect to a first horizontal direction (e.g., the X direction) and a second horizontal direction (e.g., the Y direction). The plurality of active regions ACT may constitute the plurality of active regions 118 illustrated in FIGS. 3A to 3D.

A plurality of word lines WL may extend parallel to each other in the first horizontal direction (e.g., the X direction) across the plurality of active regions ACT. A plurality of bit lines BL may extend parallel to each other in the second horizontal direction (e.g., the Y direction) crossing the first horizontal direction (e.g., the X direction) and crossing the plurality of word lines (WL).

In some embodiments of the present inventive concept, a plurality of buried contacts BC may be formed between two adjacent bit lines BL among the plurality of bit lines BL. In some embodiments of the present inventive concept, the plurality of buried contacts BC may be arranged in a line along each of the first horizontal direction (e.g., the X direction) and the second horizontal direction (e.g., the Y direction).

A plurality of landing pads LP may be formed over the plurality of buried contacts BC. The plurality of landing pads LP may be arranged to at least partially overlap the plurality of buried contacts BC. In some embodiments of the present inventive concept, each of the plurality of landing pads LP may extend to an upper portion of one of two adjacent bit lines BL.

A plurality of storage nodes may be formed on the plurality of landing pads LP. The plurality of storage nodes may be formed on the plurality of bit lines BL. The plurality of storage nodes may respectively be lower electrodes of a plurality of capacitors. The plurality of storage nodes may be respectively connected to the plurality of active regions ACT respectively through the plurality of landing pads LP and the plurality of buried contacts BC.

The semiconductor device 1 may include a dynamic random access memory (DRAM) device.

Referring to FIGS. 3A to 3D, the semiconductor device 1 may include a plurality of active regions 118 defined by an isolation layer 111 and include a substrate 110 having a plurality of word line trenches 120T crossing the plurality of active regions 118, a plurality of word lines 120 arranged in the plurality of word line trenches 120T, a plurality of bit line structures 140, and a plurality of capacitor structures 200 composed of a plurality of lower electrodes 210, a capacitor dielectric layer 220, and an upper electrode 230.

The substrate 110 may include, for example, silicon (Si), crystalline Si, polycrystalline Si, or amorphous Si. In some embodiments of the present inventive concept, the substrate 110 may include a semiconductor element, such as germanium (Ge), or at least one compound semiconductor selected from among silicon germanium (SiGe), silicon carbide (SiC), gallium arsenide (GaAs), indium arsenide (InAs), and indium phosphide (InP). In some embodiments of the present inventive concept, the substrate 110 may have a silicon on insulator (SOI) structure. For example, the substrate 110 may include a buried oxide layer (BOX layer). The substrate 110 may include a conductive region, for example, a well doped with an impurity or a structure doped with an impurity.

The plurality of active regions 118 may be parts of the substrate 110 defined by a device isolation trench 111T. The plurality of active regions 118 may have a relatively long shape having short and long axes in plan view. In some embodiments of the present inventive concept, the plurality of active regions 118 may have long axes in an oblique direction with respect to the first horizontal direction (e.g., the X direction) and the second horizontal direction (e.g., the Y direction). The plurality of active regions 118 may extend to have substantially the same length in a long-axis direction as each other and may be repeatedly arranged with a substantially constant pitch.

The device isolation layer 111 may fill the device isolation trench 111T. The plurality of active regions 118 may be defined on the substrate 110 by the device isolation layer 111.

In some embodiments of the present inventive concept, the device isolation layer 111 may be composed of a triple layer including a first device isolation layer, a second device isolation layer, and a third device isolation layer, but the present inventive concept is not limited thereto. For example, the first device isolation layer may conformally cover an inner surface and a bottom surface of the device isolation trench 111T. In some embodiments of the present inventive concept, the first device isolation layer may be formed of silicon oxide. For example, the second device isolation layer may conformally cover the first device isolation layer. In some embodiments of the present inventive concept, the second device isolation layer may be formed of silicon nitride. For example, the third device isolation layer may cover the second device isolation layer and fill the device isolation trench 111T. In some embodiments of the present inventive concept, the third device isolation layer may be formed of silicon oxide. For example, the third device isolation layer may be formed of silicon oxide composed of tonen silazene (TOSZ). In some embodiments of the present inventive concept, the device isolation layer 111 may be composed of a single layer of one type of insulating layer, a double layer of two types of insulating layers, or a multi-layer of a combination of at least four types of insulating layers. For example, the device isolation layer 111 may be composed of a single layer formed of silicon oxide.

A plurality of word line trenches 120T may be formed in the substrate 110 including the plurality of active regions 118 that are defined by the device isolation layer 111. The plurality of word line trenches 120T may have line shapes which extend parallel to each other in the first horizontal direction (e.g., the X direction) and respectively cross the plurality of active regions 118. In addition, the plurality of word line trenches 120T may have substantially the same interval in the second horizontal direction (e.g., the Y direction). In some embodiments of the present inventive concept, step differences may be formed on bottom surfaces of the plurality of word line trenches 120T.

A plurality of gate dielectric layers 122, a plurality of word lines 120, and a plurality of dummy buried insulating layers 124 may be respectively sequentially formed inside the plurality of word line trenches 120T. The plurality of word lines 120 may form the plurality of word lines WL illustrated in FIG. 2. The plurality of word lines 120 may have line shapes which extend in parallel in the first horizontal direction (e.g., the X direction), and respectively cross the plurality of active regions 118 and have substantially the same interval in the second horizontal direction (e.g., the Y direction). An upper surface of each of the plurality of word lines 120 may be at a vertical level lower than an upper surface of the substrate 110. Bottom surfaces of the plurality of word lines 120 may each have an uneven shape, and a transistor of a saddle fin structure (a saddle FinFET) may be formed in each of the plurality of active regions 118.

The plurality of word lines 120 may fill lower portions of the plurality of word line trenches 120T. The plurality of word lines 120 may each have a stacked structure of a lower word line layer 120*a* and an upper word line layer 120*b*. For example, the gate dielectric layer 122 may be formed between the lower word line layer 120*a* and a sidewall of the word line trench 120T, and the lower word line layer 120*a* may conformally cover a bottom surface and an inner wall of a partial lower portion of the word line trench 120T. For example, the upper word line layer 120*b* may cover the lower word line layer 120*a* and may fill a partial lower portion of the word line trench 120T, and the gate dielectric layer 122 may be formed between the upper word line layer 120*b* and the sidewall of the of the word line trench 120T and between the lower word line layer 120*a* and the sidewall of the of the word line trench 120T. In some embodiments of the present inventive concept, the lower word line layer 120*a* may be formed of a metal material, such as Ti, TiN, Ta, or TaN or conductive metal nitride. In some embodiments of the present inventive concept, the upper word line layer 120*b* may be formed of, for example, doped polysilicon, a metal material such as W, conductive metal nitride such as WN, TiSiN, WSiN, or a combination thereof.

A source region and a drain region may be formed by implanting impurity ions into the active regions 118 on both sides of each of the plurality of word lines 120 in the substrate 110.

The gate dielectric layer 122 may cover an inner wall and a bottom surface of the word line trench 120T. In some embodiments of the present inventive concept, the gate dielectric layer 122 may extend from a position between the word line 120 and the word line trench 120T to a position between the dummy buried insulating layer 124 and a lower portion of the word line trench 120T. The gate dielectric layer 122 may be formed of at least one of, for example, silicon oxide, silicon nitride, silicon oxynitride, oxide/nitride/oxide (ONO), and a high-k dielectric material having a higher dielectric constant than silicon oxide. For example, the gate dielectric layer 122 may have a dielectric constant of about 10 to about 25. In some embodiments of the present inventive concept, the gate dielectric layer 122 may be formed of at least one of, for example, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 122 may be formed of $HfO_2$, $Al_2O_3$, $HfAlO_3$, $Ta_2O_3$, or $TiO_2$.

The plurality of dummy buried insulating layers 124 may respectively fill partial upper portions of the plurality of word line trenches 120T. In some embodiments of the present inventive concept, upper surfaces of the plurality of dummy buried insulating layers 124 may be at substantially the same vertical level as an upper surface of the substrate 110. The dummy buried insulating layer 124 may be formed of at least one of, for example, silicon oxide, silicon nitride, silicon oxynitride, and a combination thereof. For example, the dummy buried insulating layer 124 may be formed of silicon nitride.

A first insulating layer pattern 112 and a second insulating layer pattern 114 may be disposed over the device isolation layer 111, the plurality of active regions 118, and the plurality of dummy buried insulating layers 124. For example, the first insulating layer pattern 112 and the second insulating layer pattern 114 may each be formed of silicon oxide, silicon nitride, silicon oxynitride, a metal-based dielectric material, or a combination thereof. In some embodiments of the present inventive concept, the first insulating layer patterns 112 and the second insulating layer pattern 114 may constitute a stacked structure of a plurality of insulating layers including the first insulating layer pattern 112 and the second insulating layer pattern 114. In some embodiments of the present inventive concept, the first insulating layer pattern 112 may be formed of silicon oxide, and the second insulating layer pattern 114 may be formed of silicon oxynitride. In some embodiments of the present inventive concept, the first insulating layer pattern 112 may be formed of a non-metal-based dielectric material, and the second insulating layer pattern 114 may be formed of a metal-based dielectric material. In some embodiments of the present inventive concept, the second insulating layer pattern 114 may be thicker than the first insulating layer pattern 112. For example, the first insulating layer pattern 112 may have a thickness of about 50 Å to about 90 Å, and the second insulating layer pattern 114 may have a thickness of about 60 Å to about 100 Å to be thicker than the first insulating layer pattern 112.

A plurality of direct contact conductive patterns 134 may respectively partially fill a plurality of direct contact holes 134H that penetrate the first insulating layer pattern 112 and the second insulating layer pattern 114 to expose source regions in the plurality of active regions 118. In some embodiments of the present inventive concept, the plurality of direct contact holes 134H may respectively extend into the plurality of active regions 118, that is, into the source regions. The plurality of direct contact conductive patterns 134 may each be formed of, for example, doped polysilicon. In some embodiments of the present inventive concept, the plurality of direct contact conductive patterns 134 may each be composed of an epitaxial silicon layer. The plurality of direct contact conductive patterns 134 may respectively constitute the plurality of direct contacts DC illustrated in FIG. 2.

A plurality of bit line structures 140 may be over the first insulating layer pattern 112 and the second insulating layer pattern 114. The plurality of bit line structures 140 may respectively include a plurality of bit lines 147 and a plurality of insulating capping lines 148 covering the plurality of bit lines 147. The plurality of bit line structures 140 may extend parallel to each other in the second horizontal direction (e.g., the Y direction) parallel to a main surface of the substrate 110. The plurality of bit lines 147 may constitute the plurality of bit lines BL illustrated in FIG. 2. The plurality of bit lines 147 may be respectively electrically connected to the plurality of active regions 118 through the plurality of direct contact conductive patterns 134. In some embodiments of the present inventive concept, the plurality of insulating capping lines 148 may each be formed of silicon nitride.

The plurality of bit lines 147 may each have a stacked structure of a line shape in which a first metal-based conductive pattern 145 and a second metal-based conductive pattern 146 are stacked on each other. In some embodiments of the present inventive concept, the first metal-based conductive pattern 145 may be formed of titanium nitride (TiN) or TSN (Ti—Si—N), and the second metal-based conductive pattern 146 may be formed of tungsten (W) or tungsten silicide (WSix). In some embodiments of the present inventive concept, the first metal-based conductive pattern 145 may function as a diffusion barrier.

In some embodiments of the present inventive concept, the plurality of bit lines 147 may each further include a conductive semiconductor pattern 132 between the first and second insulating layer patterns 112 and 114 and the first and second metal-based conductive patterns 145 and 146. For example, the conductive semiconductor pattern 132 may be disposed between the first metal-based conductive pattern 145 and the second insulating layer pattern 114. The conductive semiconductor pattern 132 may be formed of, for example, doped polysilicon.

A plurality of insulating spacer structures 150 may respectively cover both sidewalls of the plurality of bit line structures 140. The plurality of insulating spacer structures 150 may each include a first insulating spacer 152, a second insulating spacer 154, and a third insulating spacer 156. In some embodiments of the present inventive concept, the plurality of insulating spacer structures 150 may respectively extend into the plurality of direct contact holes 134H and respectively cover both sidewalls of the plurality of direct contact conductive patterns 134. The second insulating spacer 154 may be formed of a material with a lower permittivity than the first insulating spacer 152 and the third insulating spacer 156. In some embodiments of the present inventive concept, the first insulating spacer 152 and the third insulating spacer 156 may each be formed of nitride, and the second insulating spacer 154 may be formed of oxide. In some embodiments of the present inventive concept, the first insulating spacer 152 and the third insulating spacer 156 may each be formed of nitride, and the second insulating spacer 154 may each be formed of a material with an etching selectivity with respect to the first insulating spacer 152 and the third insulating spacer 156. For example, the first insulating spacer 152 and the third insulating spacer 156 may each be formed of nitride, and the second insulating spacer 154 may be an air spacer. In some embodiments of the present inventive concept, the plurality of insulating spacer structures 150 may each include the second insulating spacer 154, which is formed of oxide, and a third insulating spacer 156, which is formed of nitride.

A plurality of insulating fences 180 may each be in a space between a pair of insulating spacer structures 150 facing each other between a pair of adjacent bit line structures 140. The plurality of insulating fences 180 may be separated from each other and may each be arranged in a row between the pair of insulating spacer structures 150 facing each other, that is, in the second horizontal direction (e.g., the Y direction). For example, the plurality of insulating fences 180 may each be formed of nitride.

In some embodiments of the present inventive concept, each of the plurality of insulating fences 180 may penetrate the first and second insulating layer patterns 112 and 114 and extend into the dummy buried insulating layer 124, but the present inventive concept is not limited thereto. In some embodiments of the present inventive concept, each of the plurality of insulating fences 180 may penetrate the first and second insulating layer patterns 112 and 114 without extending into the dummy buried insulating layer 124, may extend into the first and second insulating layer patterns 112 and 114 without completely penetrating the first and second insulating layer patterns 112 and 114, or might not extend into the insulating layer patterns 112 and 114 and may be formed such that lower surfaces of the plurality of insulating fences 180 may be in contact with an upper surface of the second insulating layer pattern 114.

A plurality of buried contact holes 170H may be defined between the plurality of bit lines 147 and between the plurality of insulating fences 180. The plurality of buried contact holes 170H and the plurality of insulating fences 180 may be alternately arranged in spaces between the plurality of insulating spacer structures 150 that are facing each other among the plurality of insulating spacer structures 150 that are covering both sidewalls of the plurality of bit line structures 140, that is, in the second horizontal direction (e.g., the Y direction). Inner spaces of the plurality of buried contact holes 170H may each be defined by the insulating spacer structure 150, which are covering sidewalls of each of two adjacent bit lines 147, between two adjacent bit lines 147 among the plurality of bit lines 147, the insulating fence 180, and the active region 118. In some embodiments of the present inventive concept, each of the plurality of buried contact holes 170H may extend into the active region 118 from a position between the insulating spacer structure 150 and the insulating fence 180. For example, each of the plurality of buried contact holes 170H may extend into the active region 118 from a position between adjacent insulating spacer structures 150.

The plurality of buried contacts 170 may be disposed in the plurality of buried contact holes 170H. The plurality of buried contacts 170 may fill a part of a lower portion of a space between the plurality of insulating fences 180 and the plurality of insulating spacer structures 150 respectively covering both sidewalls of the plurality of bit line structures 140. The plurality of buried contacts 170 and the plurality of insulating fences 180 may be alternately arranged in the second horizontal direction (the Y direction). For example, the plurality of buried contacts 170 and the plurality of insulating fences 180 may be alternately arranged in positions between the plurality of insulating spacer structures 150 facing each other among the plurality of insulating spacer structures 150 that are covering both sidewalls of the plurality of bit line structures 140, that is, in the second horizontal direction (e.g., the Y direction). For example, the plurality of buried contacts 170 may each be formed of polysilicon.

In some embodiments of the present inventive concept, the plurality of buried contacts 170 may be arranged in a line in the first horizontal direction (e.g., the X direction) and the second horizontal direction (e.g., the Y direction). Each of the plurality of buried contacts 170 may extend from the active region 118 in a vertical direction (e.g., the Z direction) substantially perpendicular to the substrate 110. The plurality of buried contacts 170 may constitute the plurality of buried contacts BC illustrated in FIG. 2.

Levels of upper surfaces of the plurality of buried contacts 170 may be lower than levels of upper surfaces of the plurality of insulating capping lines 148. Upper surfaces of the plurality of insulating fences 180 may be at the same vertical level in the vertical direction (e.g., the Z direction) as the upper surfaces of the plurality of insulating capping lines 148.

The plurality of landing pad holes 190H may be defined by the plurality of buried contacts 170, the plurality of insulating spacer structures 150, and the plurality of insulating fences 180. The plurality of buried contacts 170 may be exposed on bottom surfaces of the plurality of landing pad holes 190H.

The plurality of landing pads 190 may respectively fill at least a part of each of the plurality of landing pad holes 190H and respectively extend onto the plurality of bit line structures 140. The plurality of landing pads 190 may be separated from each other by a plurality of recessed portions 190R. The plurality of landing pads 190 may each be composed a conductive barrier layer and a conductive pad material layer on the conductive barrier layer. For example, the conductive barrier layer may be formed of metal, conductive metal nitride, or a combination thereof. In some embodiments of the present inventive concept, the conductive barrier layer may have a Ti/TiN stacked structure. In some embodiments of the present inventive concept, the conductive pad material layer may include tungsten (W). In some embodiments of the present inventive concept, a metal silicide layer may be between the landing pad 190 and the buried contact 170. The metal silicide layer may be formed of cobalt silicide (CoSix), nickel silicide (NiSix), or manganese silicide (MnSix), but the present inventive concept is not limited thereto.

The plurality of landing pads 190 may be respectively on the plurality of buried contacts 170, and the plurality of buried contacts 170 corresponding to each other may be respectively electrically connected to the plurality of landing pads 190. The plurality of landing pads 190 may be respectively connected to the active region 118 through the plurality of buried contacts 170. The plurality of landing pads 190 may constitute the plurality of landing pads LP illustrated in FIG. 2. The plurality of buried contacts 170 may each be between two adjacent bit line structures 140, and the plurality of landing pads 190 may each extend from a position between two adjacent bit line structures 140 with the buried contact 170 therebetween onto one bit line structure 140.

The plurality of recessed portions 190R may be respectively filled with a plurality of insulating structures 195. In some embodiments of the present inventive concept, the plurality of insulating structure 195 may each be composed of an interlayer insulating layer and an etch stop layer. For example, the interlayer insulating layer may be formed of oxide, and the etch stop layer may be formed of nitride. For example, the etch stop layer may be formed of silicon nitride or silicon boron nitride (SiBN). Upper surfaces of the plurality of insulating structures 195 and upper surfaces of the plurality of landing pads 190 are illustrated to be in the same vertical level as each other in FIGS. 3A and 3C, but the present inventive concept is not limited thereto. For example, the plurality of insulating structures 195 may respectively fill the plurality of recessed portions 190R and respectively cover the upper surfaces of the plurality of landing pads 190, and accordingly, the upper surfaces of the plurality of insulating structures 195 may be in the higher vertical level than the upper surfaces of the plurality of landing pads 190.

A plurality of capacitor structures 200, which include a plurality of lower electrodes 210, a capacitor dielectric layer 220, and an upper electrode 230, may be on the plurality of landing pads 190 and the plurality of insulating structures 195. The lower electrode 210 and the landing pad 190, which correspond to each other, may be electrically connected to each other. The upper surfaces of the plurality of insulating structures 195 and upper surfaces of the plurality of landing pads 190 are illustrated to be at the same vertical level as each other in FIGS. 3A and 3C, but the present inventive concept is not limited thereto.

In some embodiments of the present inventive concept, the semiconductor device 1 may further include at least one support pattern in contact with sidewalls of the plurality of lower electrodes 210 to support the plurality of lower electrodes 210. The at least one support pattern may be formed of any one of silicon nitride (SiN), silicon carbonitride (SiCN), N-rich silicon nitride (N-rich SiN), and/or Si-rich silicon nitride (Si-rich SiN), but the present inventive concept is not limited thereto. In some embodiments of the present inventive concept, the at least one support pattern may include a plurality of support patterns that are in contact with sidewalls of the plurality of lower electrodes 210 and are in different vertical levels to be separated from each other in the vertical direction (e.g., the Z direction).

The plurality of lower electrodes 210 may each have a column shape filled with a material therein to have a circular horizontal cross section, that is, a pillar shape but are not limited thereto. In some embodiments of the present inventive concept, the plurality of lower electrodes 210 may each have a cylindrical shape having a closed lower portion. In some embodiments of the present inventive concept, the plurality of lower electrodes 210 may have a honeycomb shape arranged in a zigzag pattern in the first horizontal direction (e.g., the X direction) or the second horizontal direction (e.g., the Y direction). In some embodiments of the present inventive concept, the plurality of lower electrodes 210 may be arranged in a matrix in a line in the first horizontal direction (e.g., the X direction) and the second horizontal direction (e.g., the Y direction). The plurality of lower electrodes 210 may include silicon doped with impurities, a metal such as tungsten or copper, or a conductive metal compound such as titanium nitride. In some embodiments of the present inventive concept, the plurality of lower electrodes 210 may include TiN, CrN, VN, MoN, NbN, TiSiN, TiAlN, or TaAlN.

The capacitor dielectric layer 220 may conformally cover surfaces of the plurality of lower electrodes 210. In some embodiments of the present inventive concept, the capacitor dielectric layer 220 may be integrally formed to cover all surfaces of the plurality of lower electrodes 210 in a certain region, for example, one memory cell region (CR in FIG. 2).

The capacitor dielectric layer 220 may include a material with antiferroelectricity, a material with ferroelectricity, or a material with both antiferroelectricity and ferroelectricity. For example, the capacitor dielectric layer 220 may be formed of silicon oxide, metal oxide, or a combination thereof. In some embodiments of the present inventive concept, the capacitor dielectric layer 220 may include a dielectric material composed of $ABO_3$ or $MO_x$. For example, the capacitor dielectric layer 220 may be formed of SiO, TaO, TaAlO, TaON, AlO, AlSiO, HfO, HfSiO, ZrO, RuO, WO, HfZrO, ZrSiO, TiO, TiAO, VO, NbO, MoO, MnO, LaO YO, CoO, NiO, CuO, ZnO, FeO, SrO, BaO, BST((Ba, Sr)TiO), STO(SrTiO), BTO(BaTiO), PTO(PbTiO), AgNbO, BiFeO, PZT(Pb(Zr,Ti)O), (Pb,La)(Zr,Ti)O, Ba(Zr,Ti)O, Sr(Zr,Ti)O, or a combination thereof.

The upper electrode 230 may be integrally formed over the plurality of lower electrodes 210 in a certain region, for example, one memory cell region (CR in FIG. 2). The plurality of lower electrodes 210, the capacitor dielectric layer 220, and the upper electrode 230 may constitute a plurality of capacitor structures 200 in a certain region, for example, one memory cell region (CR in FIG. 2).

The upper electrode 230 may include silicon doped with impurities, a metal such as tungsten or copper, or a conductive metal compound such as titanium nitride. In some embodiments of the present inventive concept, the upper electrode 230 may include TiN, CrN, VN, MoN, NbN, TiSiN, TiAlN, or TaAlN. In some embodiments of the present inventive concept, the upper electrode 230 may have a stacked structure of at least two of a semiconductor material layer doped with impurities, a main electrode layer, and an interface layer. The doped semiconductor material layer may include, for example, doped polysilicon or doped polycrystalline silicon germanium (SiGe). The main electrode layer may be formed of a metal material. The main electrode layer may be formed of, for example, W, Ru, RuO, Pt, PtO, Ir, IrO, SRO (SrRuO), BSRO ((Ba,Sr)RuO), CRO (CaRuO), BaRuO, La(Sr,Co)O, or so on. In some embodiments of the present inventive concept, the main electrode layer may be formed of W. The interfacial layer may include at least one of, for example, metal oxide, metal nitride, metal carbide, and/or metal silicide.

Figure 4A:
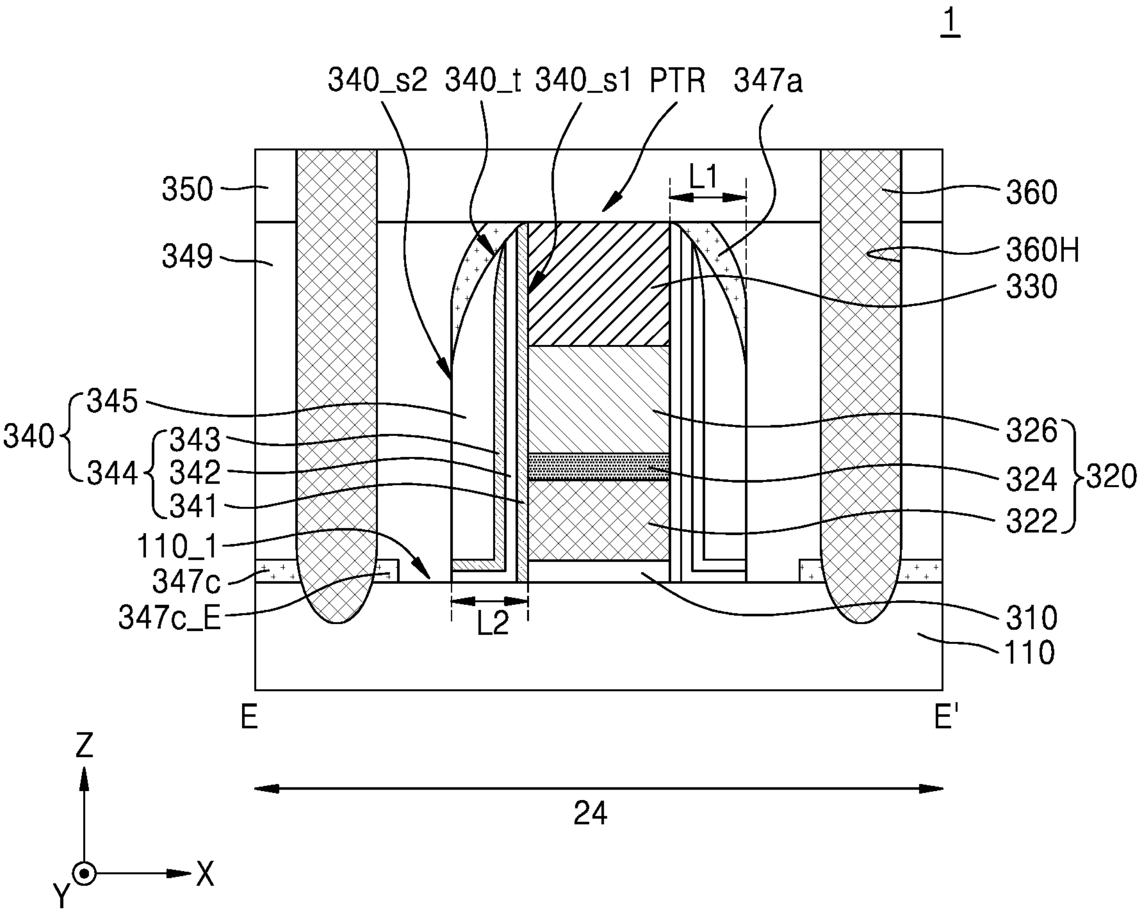
FIG. 4A is a cross-sectional view of a semiconductor device which is taken along line E-E' of FIG. 2, according to an embodiment of the present inventive concept.

FIG. 4A is a cross-sectional view of a semiconductor device which is taken along line E-E' of FIG. 2, according to an embodiment of the present inventive concept. Specifically, FIG. 4A is a cross-sectional view illustrating a peripheral circuit element PTR in the peripheral circuit region 24 of the semiconductor device 1 according to an embodiment of the present inventive concept.

Referring to FIG. 4A, the semiconductor device 1 may include a peripheral circuit gate insulating layer 310, a peripheral circuit gate structure 320, a peripheral circuit capping line 330, a peripheral circuit spacer structure 340, a peripheral circuit top spacer insulating layer 347*a*, a peripheral circuit etch stop layer 347*c*, a peripheral circuit first interlayer insulating layer 349, a peripheral circuit second interlayer insulating layer 350, and a peripheral circuit contact 360.

In some embodiments of the present inventive concept, the peripheral circuit gate insulating layer 310 may extend along an upper surface of the substrate 110 in the peripheral circuit region 24. The peripheral circuit gate insulating layer 310 may include, for example, silicon oxide, silicon nitride, silicon oxynitride, or a high-k material with a higher dielectric constant than silicon oxide.

In some embodiments of the present inventive concept, the peripheral circuit element PTR may be disposed on the peripheral circuit gate insulating layer 310. For example, the peripheral circuit element PTR may include the peripheral circuit gate structure 320 extending in the second horizontal direction (e.g., the Y direction) on the substrate 110 in the peripheral circuit region 24, the peripheral circuit capping line 330 covering the peripheral circuit gate structure 320, the peripheral circuit spacer structure 340 disposed on sidewalls of the peripheral circuit gate structure 320 and the peripheral circuit capping line 330, and the peripheral circuit top spacer insulating layer 347*a* disposed on an upper surface 340_*t* of the peripheral circuit spacer structure 340.

In some embodiments of the present inventive concept, the peripheral circuit gate structure 320 may include a first conductive layer 322, a second conductive layer 324, and a third conductive layer 326 which are sequentially stacked on each other. The first conductive layer 322 may be disposed on the peripheral circuit gate insulating layer 310. The second conductive layer 324 may be disposed on the first conductive layer 322. The third conductive layer 326 may be disposed on the second conductive layer 324.

In some embodiments of the present inventive concept, components of peripheral circuit gate structure 320 are at substantially the same levels as components of the plurality of bit lines 147 on the substrate 110 in the cell region 20 (see FIG. 1). For example, the first conductive layer 322 may be at substantially the same level as the conductive semiconductor pattern 132 (see FIGS. 3A to 3D). For example, the second conductive layer 324 may be at substantially the same level as the first metal-based conductive pattern 145 (see FIGS. 3A to 3D). For example, the third conductive layer 326 may be at substantially the same level as the second metal-based conductive pattern 146 (see FIGS. 3A to 3D).

In some embodiments of the present inventive concept, the first conductive layer 322 may be formed by the same process as the conductive semiconductor pattern 132. For example, the first conductive layer 322 may be formed of the same material as the conductive semiconductor pattern 132. For example, the first conductive layer 322 may be formed of doped polysilicon. A thickness of the first conductive layer 322 in the vertical direction (e.g., the Z direction) may be substantially equal to a thickness of the conductive semiconductor pattern 132 in the vertical direction (e.g., the Z direction).

In some embodiments of the present inventive concept, the second conductive layer 324 may be formed by the same process as the first metal-based conductive pattern 145. For example, the second conductive layer 324 may be formed of the same material as the first metal-based conductive pattern 145. For example, the second conductive layer 324 may be formed of titanium nitride (TiN) or Ti—Si—N(TSN). A thickness of the second conductive layer 324 in the vertical direction (e.g., the Z direction) may be substantially equal to a thickness of the first metal-based conductive pattern 145 in the vertical direction (e.g., the Z direction).

In some embodiments of the present inventive concept, the third conductive layer 326 may be formed by the same process as the second metal-based conductive pattern 146. For example, the third conductive layer 326 may be formed of the same material as the second metal-based conductive pattern 146. For example, the third conductive layer 326 may be formed of titanium nitride (TiN) or Ti—Si—N (TSN). A thickness of the third conductive layer 326 in the vertical direction (e.g., the Z direction) may be substantially equal to a thickness of the second metal-based conductive pattern 146 in the vertical direction (e.g., the Z direction).

In some embodiments of the present inventive concept, the peripheral circuit capping line 330 may be disposed on the peripheral circuit gate structure 320. In some embodiments of the present inventive concept, the peripheral circuit capping line 330 may be at substantially the same level as the insulating capping line 148 (see FIGS. 3A to 3D) on the substrate 110 in the cell region 20. In some embodiments of the present inventive concept, the peripheral circuit capping line 330 may be formed by substantially the same process as the insulating capping line 148. For example, the peripheral circuit capping line 330 may be formed of the same material as the insulating capping line 148. For example, the peripheral circuit capping line 330 may be formed of silicon nitride. A thickness of the peripheral circuit capping line 330 in the vertical direction (e.g., the Z direction) may be substantially equal to a thickness of the insulating capping line 148 in the vertical direction (e.g., the Z direction).

In some embodiments of the present inventive concept, the peripheral circuit spacer structure 340 may include a peripheral circuit offset layer 344, which is disposed on sidewalls of the peripheral circuit gate structure 320 and the peripheral circuit capping line 330, and a peripheral circuit spacer 345 that is disposed on the peripheral circuit offset layer 344.

In some embodiments of the present inventive concept, the peripheral circuit offset layer 344 may include silicon nitride. In some embodiments of the present inventive concept, the peripheral circuit offset layer 344 may include a first peripheral circuit offset layer 341, a second peripheral circuit offset layer 342, and a third peripheral circuit offset layer 343 sequentially arranged on sidewalls of the peripheral circuit gate structure 320 and the peripheral circuit capping line 330. For example, the first peripheral circuit offset layer 341 may include silicon nitride. For example, the second peripheral circuit offset layer 342 may include silicon oxide. For example, the third peripheral circuit offset layer 343 may include silicon nitride.

In some embodiments of the present inventive concept, the peripheral circuit offset layer 344 may have an L-shaped cross section. For example, the peripheral circuit offset layer 344 may include a vertical portion, which extends in the first vertical direction (e.g., the Z direction) along sidewalls of the peripheral circuit gate structure 320 and the peripheral circuit capping line 330, and a horizontal portion extending in the first horizontal direction (e.g., the X direction). The horizontal portion may be separated from the peripheral circuit gate structure 320 with the vertical portion therebetween.

In some embodiments of the present inventive concept, when the peripheral circuit offset layer 344 includes the first to third peripheral circuit offset layers 341, 342, and 343, the horizontal portion may be formed as a part of each of the first to third peripheral circuit offset layers 341, 342, and 343, and the vertical portion may be formed as a part of each of the second and third peripheral circuit offset layers 342 and 343. In other words, while the first peripheral circuit offset layer 341 is formed as the vertical portion, the second and third peripheral circuit offset layers 342 and 343 may be respectively formed as the vertical portion and the horizontal portion.

In some embodiments of the present inventive concept, unlike the illustration, both the vertical portion and the horizontal portion may be formed from the first to third peripheral circuit offset layers 341, 342, and 343. For example, each of the first to third peripheral circuit offset layers 341, 342, and 343 may include the vertical portion and the horizontal portion.

In some embodiments of the present inventive concept, unlike the illustration, the peripheral circuit offset layer 344 may have an I-shaped cross section. For example, the peripheral circuit offset layer 344 may include the vertical portion extending in the vertical direction (e.g., the Z direction) on sidewalls of the peripheral circuit gate structure 320 and the peripheral circuit capping line 330. For example, the peripheral circuit offset layer 344 might not include a horizontal portion.

In some embodiments of the present inventive concept, vertical portions of the first to third peripheral circuit offset layers 341, 342, and 343 may have the same thickness as each other in the first horizontal direction (e.g., the X direction). In some embodiments of the present inventive concept, the vertical portion of the first to third peripheral circuit offset layers 341, 342, and 343 may have different thicknesses from each other in the first horizontal direction (e.g., the X direction). For example, a thickness of the first peripheral circuit offset layer 341 in the first horizontal direction (e.g., the X direction) may be greater than thicknesses of the second and third peripheral circuit offset layers 342 and 343 in the first horizontal direction (e.g., the X direction).

In some embodiments of the present inventive concept, heights of the first, second, and third peripheral circuit offset layers 341, 342, and 343 in the vertical direction (e.g., the Z direction) may be reduced as a distance from the peripheral circuit gate structure 320 in the first horizontal direction (e.g., the X direction) increases. For example, the height of the second peripheral circuit offset layer 342 in the vertical direction (e.g., the Z direction) may be less than the height of the first peripheral circuit offset layer 341 in the vertical direction (e.g., the Z direction), and the height of the third peripheral circuit offset layer 343 may be less than the height of the second peripheral circuit offset layer 342 in the vertical direction (e.g., the Z direction). However, the present inventive concept is not limited to what is illustrated, and the heights of the first, second, and third peripheral circuit offset layers 341, 342, and 343 in the vertical direction (e.g., the Z direction) may be all the same or different from what is described above.

In some embodiments of the present inventive concept, the peripheral circuit spacer 345 may be disposed on a sidewall of the peripheral circuit offset layer 344. For example, the peripheral circuit spacer 345 may be separated from the peripheral circuit gate structure 320 with the peripheral circuit offset layer 344 disposed therebetween. In some embodiments of the present inventive concept, the peripheral circuit spacer 345 may include silicon oxide.

In some embodiments of the present inventive concept, when the peripheral circuit offset layer 344 has an L-shaped cross section, the peripheral circuit spacer 345 may be disposed on a horizontal portion of the peripheral circuit offset layer 344. For example, the peripheral circuit spacer 345 may be separated from the substrate 110 with the horizontal portion of the peripheral circuit offset layer 344 disposed therebetween.

In some embodiments of the present inventive concept, a height of the peripheral circuit spacer 345 in the vertical direction (e.g., the Z direction) may be less than the height of the peripheral circuit offset layer 344 in the vertical direction (e.g., the Z direction). For example, the height of the peripheral circuit spacer 345 in the vertical direction (e.g., the Z direction) may be less than the height of the third peripheral circuit offset layer 343 in the vertical direction (e.g., the Z direction). For example, a height of the peripheral circuit spacer structure 340 in the vertical direction (e.g., the Z direction) may be reduced as a distance from the peripheral circuit gate structure 320 in the first horizontal direction (e.g., the X direction) increases. For example, a vertical level of the upper surface 340_t of the peripheral circuit spacer structure 340 may be reduced as the distance from the peripheral circuit gate structure 320 in the first horizontal direction (e.g., the X direction) increases. For example, the upper surface 340_t of the peripheral circuit spacer structure 340 may be rounded or curved. However, the present inventive concept is not limited to what is illustrated, and the height of the peripheral circuit spacer 345 in the vertical direction (e.g., the Z direction) may be substantially equal to the height of the third peripheral circuit offset layer 343 in the vertical direction (e.g., the Z direction).

In some embodiments of the present inventive concept, the peripheral circuit element PTR may further include the peripheral circuit top spacer insulating layer 347a conformally covering the upper surface 340_t of the peripheral circuit spacer structure 340. In some embodiments of the present inventive concept, the peripheral circuit top spacer insulating layer 347a may conformally cover the upper surface 340_t and a part of a second sidewall 340_s2 of the peripheral circuit spacer structure 340. In some embodiments of the present inventive concept, the peripheral circuit top spacer insulating layer 347a may include silicon nitride.

In some embodiments of the present inventive concept, when a vertical level of the upper surface 340_t of the peripheral circuit spacer structure 340 is reduced as a distance from the peripheral circuit gate structure 320 in the first horizontal direction (e.g., the X direction) increases, a vertical level of the peripheral circuit top spacer insulating layer 347a may also be reduced as the distance from the peripheral circuit gate structure 320 in the first horizontal direction (e.g., the X direction) increases. For example, vertical levels of upper and lower surfaces of the peripheral circuit top spacer insulating layer 347a may be reduced as the distance from the peripheral circuit gate structure 320 in the first horizontal direction (e.g., the X direction) increases. However, the present inventive concept is not limited to what is illustrated, and the vertical level of the upper surface of the peripheral circuit top spacer insulating layer 347a may be substantially constant.

In some embodiments of the present inventive concept, the peripheral circuit top spacer insulating layer 347a might not be formed on at least a part of the sidewall of the peripheral circuit spacer structure 340. For example, the peripheral circuit spacer structure 340 may have a first sidewall 340_s1, on which the peripheral circuit gate structure 320 is arranged, and a second sidewall 340_s2 that is opposite to the first sidewall 340_s1. For example, the first sidewall 340_s1 may be in contact with the peripheral circuit gate structure 320. The peripheral circuit top spacer insulating layer 347a might not be formed on at least a part of the second sidewall 340_s2.

In some embodiments of the present inventive concept, the peripheral circuit top spacer insulating layer 347a might not overlap at least a part of the first sidewall 340_s1 in the first horizontal direction (e.g., the X direction). In some embodiments of the present inventive concept, the peripheral circuit top spacer insulating layer 347a might not overlap at least a part of the second sidewall 340_s2 in the first horizontal direction (e.g., the X direction). For example, each of the first sidewall 340_s1 and the second sidewall 340_s2 may include at least a part that does not overlap the peripheral circuit top spacer insulating layer 347a in the first horizontal direction (e.g., the X direction). For example, at least a part of the peripheral circuit offset layer 344 might not overlap the peripheral circuit top spacer insulating layer 347a in the first horizontal direction (e.g., the X direction). For example, at least a part of the peripheral circuit spacer 345 might not overlap the peripheral circuit top spacer insulating layer 347a in the first horizontal direction (e.g., the X direction).

In some embodiments of the present inventive concept, a part of the substrate 110 in the peripheral circuit region 24 may include a first portion 110_1 that does not overlap, in the vertical direction (e.g., the Z direction), the peripheral circuit etch stop layer 347c, the peripheral circuit spacer structure 340, and the peripheral circuit gate structure 320. For example, the first portion 110_1 may refer to a part of the substrate 110 that does not overlap, in the vertical direction (e.g., the Z direction), the peripheral circuit etch stop layer 347c and the peripheral circuit spacer structure 340 adjacent to the peripheral circuit etch stop layer 347c, and the part of the substrate 110 is positioned between the peripheral circuit etch stop layer 347c and the peripheral circuit spacer structure 340 adjacent to each other. In some embodiments of the present inventive concept, the peripheral circuit top spacer insulating layer 347a might not overlap the first portion 110_1 of the substrate 110 in the vertical direction (e.g., the Z direction).

In some embodiments of the present inventive concept, the peripheral circuit top spacer insulating layer 347a might not include a portion that does not overlap the peripheral circuit spacer structure 340 in the vertical direction (e.g., the Z direction).

In some embodiments of the present inventive concept, a width L1 of the peripheral circuit top spacer insulating layer 347a in the first horizontal direction (e.g., the X direction) may be less than or equal to a width L2 of the peripheral circuit offset layer 344 in the first horizontal direction (e.g., the X direction). For example, the width L1 of the peripheral circuit top spacer insulating layer 347a in the first horizontal direction (e.g., the X direction) may be less than or equal to the greatest width L2 of a horizontal portion of the peripheral circuit offset layer 344 in the first horizontal direction (e.g., the X direction). However, the present inventive concept is not limited thereto. For example, the width L1 of the peripheral circuit top spacer insulating layer 347a in the first horizontal direction (e.g., the X direction) may be greater than the greatest width L2 of a horizontal portion of the peripheral circuit offset layer 344 in the first horizontal direction (e.g., the X direction).

In some embodiments of the present inventive concept, the peripheral circuit etch stop layer 347c may be on a partial region of the substrate 110 in the peripheral circuit region 24. For example, the peripheral circuit etch stop layer 347c may be separated from the peripheral circuit gate structure 320 and the peripheral circuit spacer structure 340 in the first horizontal direction (e.g., the X direction). For example, the peripheral circuit etch stop layer 347*c* may be separated from the peripheral circuit offset layer 344 in the first horizontal direction (e.g., the X direction). For example, the peripheral circuit etch stop layer 347*c* may be separated from the peripheral circuit gate structure 320 and the peripheral circuit spacer structure 340 in the first horizontal direction (e.g., the X direction) with the peripheral circuit first interlayer insulating layer 349 disposed therebetween. For example, the peripheral circuit etch stop layer 347*c* may be separated from the peripheral circuit offset layer 344 in the first horizontal direction (e.g., the X direction) with the peripheral circuit first interlayer insulating layer 349 disposed therebetween. The peripheral circuit etch stop layer 347*c* may include the same material as that of the peripheral circuit top spacer insulating layer 347*a*. For example, the peripheral circuit etch stop layer 347*c* may include silicon nitride.

In some embodiments of the present inventive concept, the peripheral circuit etch stop layer 347*c* might not overlap the peripheral circuit top spacer insulating layer 347*a*. For example, the peripheral circuit etch stop layer 347*c* might not overlap the peripheral circuit top spacer insulating layer 347*a* in the first horizontal direction (e.g., the X direction) and the vertical direction (e.g., the Z direction).

In some embodiments of the present inventive concept, the peripheral circuit etch stop layer 347*c* may have an end portion 347*c*_E disposed between the peripheral circuit contact 360 penetrating the peripheral circuit etch stop layer 347*c* and the peripheral circuit spacer structure 340. The end portion 347*c*_E of the peripheral circuit etch stop layer 347*c* may be separated from the peripheral circuit spacer structure 340 in the first horizontal direction (e.g., the X direction) with the peripheral circuit first interlayer insulating layer 349 disposed therebetween.

In some embodiments of the present inventive concept, the peripheral circuit first interlayer insulating layer 349 at least partially surrounding the peripheral circuit element PTR may be provided, and the peripheral circuit second interlayer insulating layer 350 may be disposed on the peripheral circuit first interlayer insulating layer 349. For example, the peripheral circuit first interlayer insulating layer 349 may at least partially surround, in the first horizontal direction (e.g., the X direction), the peripheral circuit gate insulating layer 310, the peripheral circuit gate structure 320, the peripheral circuit capping line 330, the peripheral circuit spacer structure 340, and the peripheral circuit top spacer insulating layer 347*a*. The peripheral circuit first interlayer insulating layer 349 may be disposed on the peripheral circuit etch stop layer 347*c*. The peripheral circuit first interlayer insulating layer 349 may be separated from a partial region of the substrate 110 with the peripheral circuit etch stop layer 347*c* disposed therebetween. The peripheral circuit first interlayer insulating layer 349 may be in contact with the first portion 110_1 of the substrate 110. For example, the peripheral circuit second interlayer insulating layer 350 may be disposed on the peripheral circuit gate structure 320. The peripheral circuit second interlayer insulating layer 350 may be at a vertical level higher than that of the peripheral circuit gate insulating layer 310, the peripheral circuit gate structure 320, the peripheral circuit capping line 330, the peripheral circuit spacer structure 340, and the peripheral circuit top spacer insulating layer 347*a*. In some embodiments of the present inventive concept, the peripheral circuit first interlayer insulating layer 349 may include silicon oxide, and the peripheral circuit second interlayer insulating layer 350 may include silicon nitride.

In some embodiments of the present inventive concept, the peripheral circuit first interlayer insulating layer 349 may be between the peripheral circuit contact 360 and the peripheral circuit spacer structure 340. In some embodiments of the present inventive concept, the peripheral circuit first interlayer insulating layer 349 may be in contact with the peripheral circuit spacer 345. For example, the peripheral circuit first interlayer insulating layer 349 that may include silicon oxide may be in contact with the peripheral circuit spacer 345 that may include silicon oxide.

In other words, the peripheral circuit etch stop layer 347*c* that may include silicon nitride may be separated from the peripheral circuit offset layer 344, which may include silicon nitride, in the first horizontal direction (e.g., the X direction) with the peripheral circuit first interlayer insulating layer 349, which may include silicon oxide, disposed therebetween.

In some embodiments of the present inventive concept, the peripheral circuit contact 360 may be disposed in the peripheral circuit contact hole 360H that sequentially penetrates the peripheral circuit second interlayer insulating layer 350, the peripheral circuit first interlayer insulating layer 349, and the peripheral circuit etch stop layer 347*c*. The peripheral circuit contact 360 may be connected to a portion of the substrate 110 in the peripheral circuit region 24.

Figure 4B:
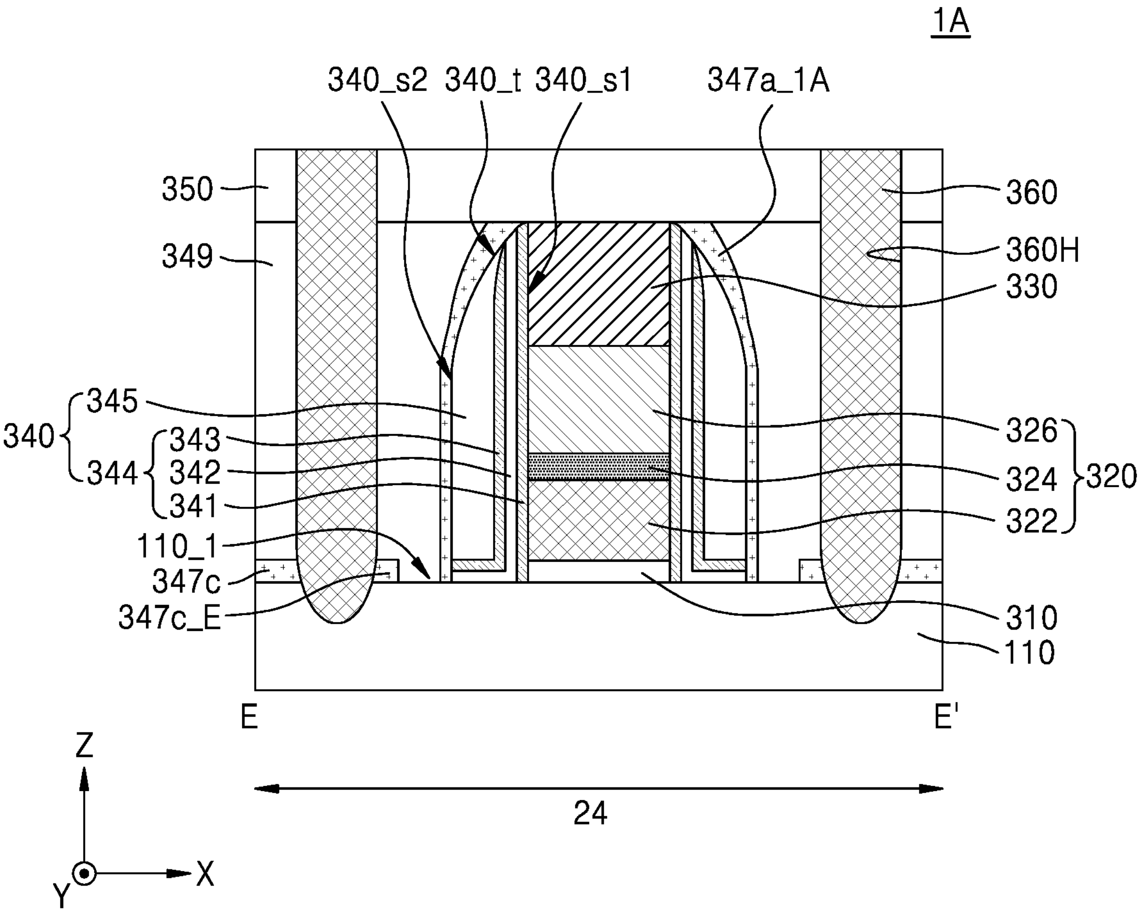
FIG. 4B is a cross-sectional view of a semiconductor device according to an embodiment of the present inventive concept.

FIG. 4B is a cross-sectional view of a semiconductor device 1A according to an embodiment of the present inventive concept. For example, FIG. 4B is a cross-sectional view illustrating an embodiment of the semiconductor device 1 illustrated in FIG. 4A. Hereinafter, components that are different from the components of the semiconductor device 1 of FIG. 4A are mainly described, and descriptions of the other components previously given with reference to FIG. 4A may be omitted or briefly discussed.

Referring to FIG. 4B, the semiconductor device 1A may include a peripheral circuit top spacer insulating layer 347*a*_1A disposed on the upper surface 340_*t* and the second sidewall 340_*s*2 of the peripheral circuit spacer structure 340. The peripheral circuit top spacer insulating layer 347*a*_1A may conformally cover the upper surface 340_*t* and the second sidewall 340_*s*2 of the peripheral circuit spacer structure 340.

In some embodiments of the present inventive concept, the peripheral circuit spacer structure 340 may overlap the peripheral circuit top spacer insulating layer 347*a*_1A in the first horizontal direction (e.g., the X direction). For example, the first sidewall 340_*s*1 and the second sidewall 340_*s*2 of the peripheral circuit spacer structure 340 might not include portions that do not overlap the peripheral circuit top spacer insulating layer 347*a*_1A in the first horizontal direction (e.g., the X direction). For example, the peripheral circuit offset layer 344 may completely overlap the peripheral circuit top spacer insulating layer 347*a*_1A in the first horizontal direction (e.g., the X direction). For example, at least a part of the peripheral circuit spacer 345 may completely overlap the peripheral circuit top spacer insulating layer 347*a*_1A in the first horizontal direction (e.g., the X direction).

In some embodiments of the present inventive concept, a part of the substrate 110 in the peripheral circuit region 24 of the semiconductor device 1A may include a first portion 110_1 that does not overlap, in the vertical direction (e.g., the Z direction), the peripheral circuit etch stop layer 347*c*, the peripheral circuit spacer structure 340, and the peripheral circuit gate structure 320. In some embodiments of the present inventive concept, the first portion 110_1 of the substrate 110 of the semiconductor device 1A may include at least a part that does not overlap the peripheral circuit top spacer insulating layer 347*a*_1A. In some embodiments of the present inventive concept, the peripheral circuit top spacer insulating layer 347*a*_1A of the semiconductor device 1A may overlap a part of the first portion 110_1 of the substrate 110 in the vertical direction (e.g., the Z direction).

In some embodiments of the present inventive concept, the peripheral circuit etch stop layer 347*c* of the semiconductor device 1A may overlap the peripheral circuit top spacer insulating layer 347*a*_1A in the first horizontal direction (e.g., the X direction). In some embodiments of the present inventive concept, the peripheral circuit etch stop layer 347*c* may be separated from the peripheral circuit top spacer insulating layer 347*a*_1A in the first horizontal direction (e.g., the X direction) with the peripheral circuit first interlayer insulating layer 349 disposed therebetween. For example, the peripheral circuit etch stop layer 347*c* that may include silicon nitride may still be separated from the peripheral circuit top spacer insulating layer 347*a*_1A, which may include silicon nitride, in the first horizontal direction (e.g., the X direction) with the peripheral circuit first interlayer insulating layer 349, which may include silicon oxide, disposed therebetween.

In some embodiments of the present inventive concept, the peripheral circuit etch stop layer 347*c* of the semiconductor device 1A may have an end portion 347*c*_E between the peripheral circuit contact 360 and the peripheral circuit spacer structure 340. The end portion 347*c*_E of the peripheral circuit etch stop layer 347*c* may be separated from the peripheral circuit spacer structure 340 with the peripheral circuit first interlayer insulating layer 349 disposed therebetween. The end portion 347*c*_E of the peripheral circuit etch stop layer 347*c* may be separated from the peripheral circuit top spacer insulating layer 347*a*_1A with the peripheral circuit first interlayer insulating layer 349 disposed therebetween.

In some embodiments of the present inventive concept, the peripheral circuit first interlayer insulating layer 349 of the semiconductor device 1A may be separated from the peripheral circuit spacer 345 with the peripheral circuit top spacer insulating layer 347*a*_1A disposed therebetween. In other words, the peripheral circuit first interlayer insulating layer 349 might not be in contact with the peripheral circuit spacer 345. For example, the peripheral circuit first interlayer insulating layer 349, which may include silicon oxide, might not be in contact with the peripheral circuit spacer 345 that may include silicon oxide.

Figure 5:
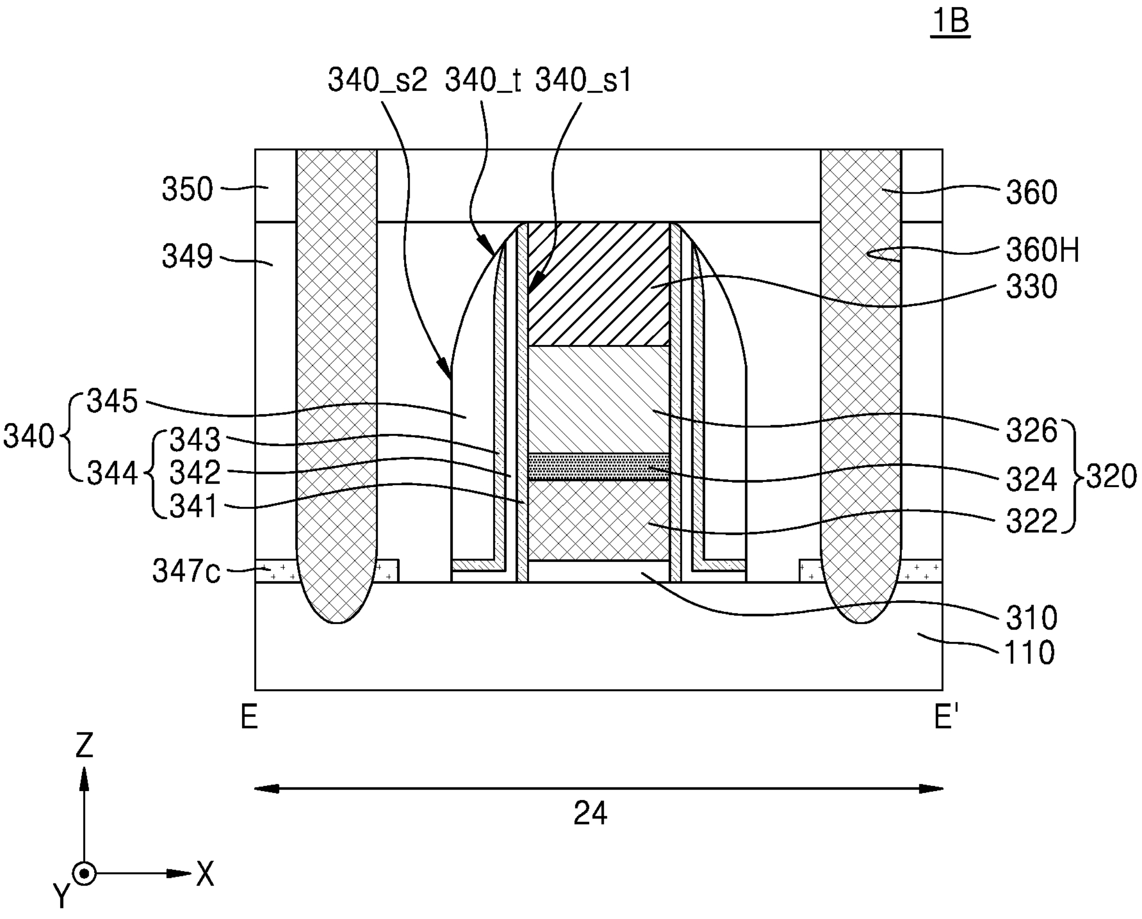
FIG. 5 is a cross-sectional view of a semiconductor device according to an embodiment of the present inventive concept.

FIG. 5 is a cross-sectional view of a semiconductor device 1B according to an embodiment of the present inventive concept. For example, FIG. 5 is a cross-sectional view illustrating an embodiment of the semiconductor device 1 illustrated in FIG. 4A.

Referring to FIG. 5, the semiconductor device 1B might not include the peripheral circuit top spacer insulating layer 347*a* (see FIG. 4A), unlike the semiconductor device 1. In other words, the peripheral circuit first interlayer insulating layer 349 may be formed on the upper surface 340_*t* and the second sidewall 340_*s*2 of the peripheral circuit spacer structure 340. For example, the peripheral circuit first interlayer insulating layer 349 may be in contact with the upper surface 340_*t* and the second sidewall 340_*s*2 of the peripheral circuit spacer structure 340. For example, the peripheral circuit first interlayer insulating layer 349 may be in contact with an upper surface and a sidewall of the peripheral circuit spacer 345.

Figure 6A:
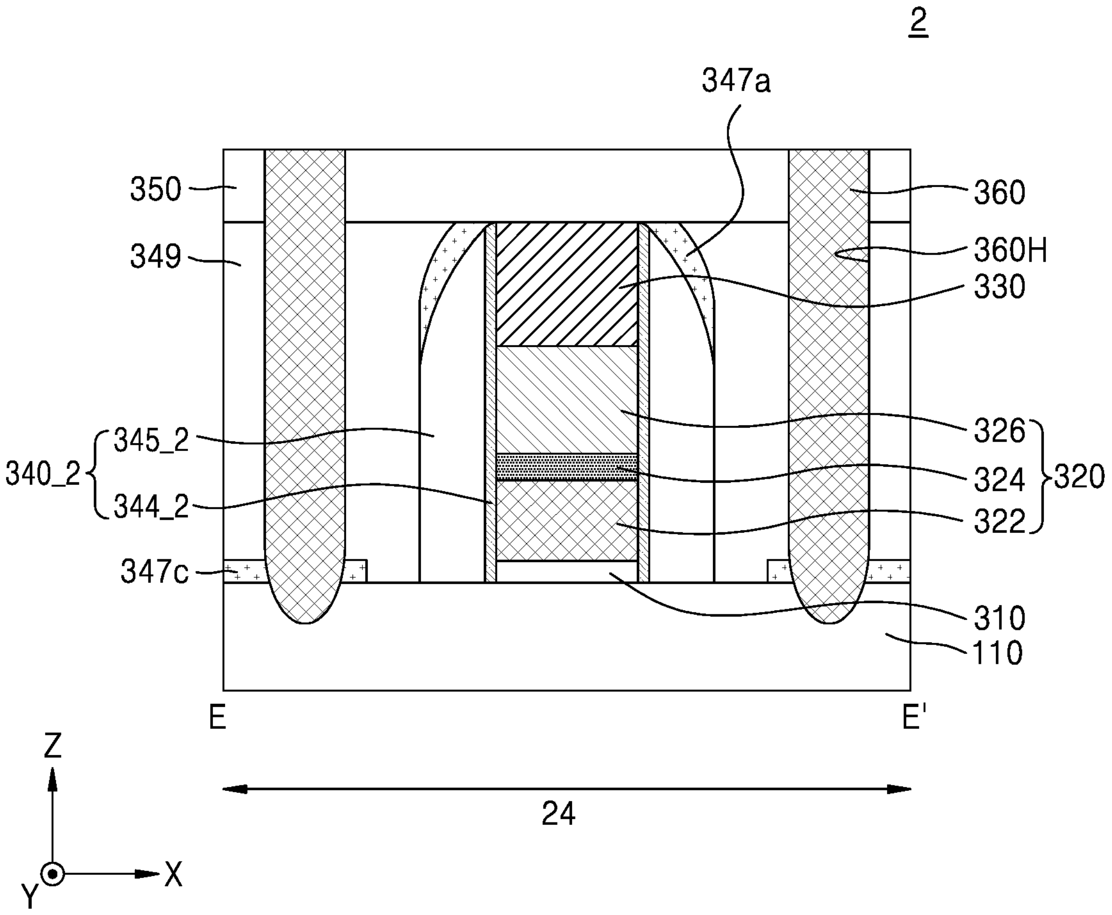
FIGS. 6A and 6B are cross-sectional views of semiconductor devices according to some embodiments of the present inventive concept.
Figure 6B:
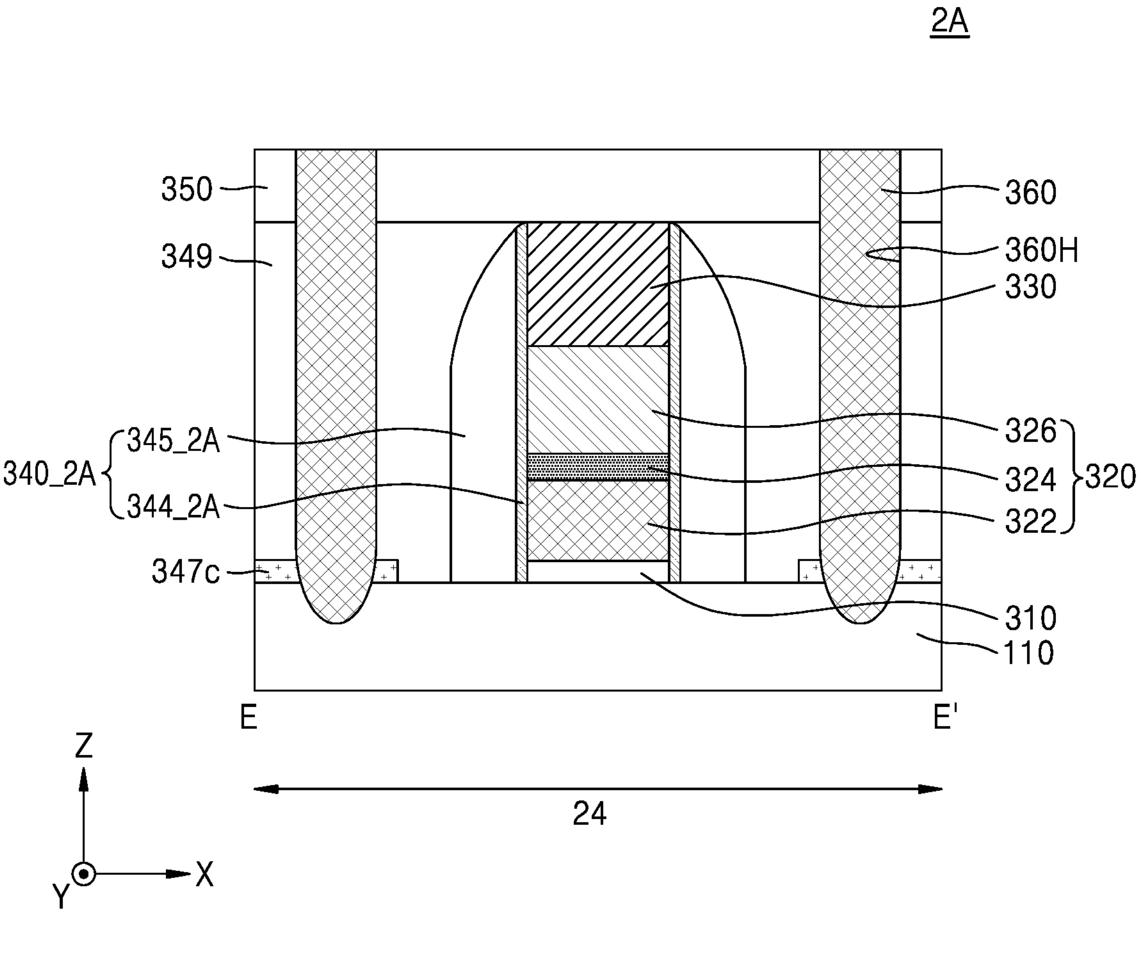

FIGS. 6A and 6B are respectively cross-sectional views of semiconductor devices 2 and 2A according to some embodiments of the present inventive concept. Specifically, FIG. 6A is a cross-sectional view illustrating an embodiment of the semiconductor device 1 illustrated in FIG. 4A, and FIG. 6B is a cross-sectional view illustrating an embodiment of the semiconductor device 2 illustrated in FIG. 6A.

Referring to FIG. 6A, the semiconductor device 2 may include a peripheral circuit spacer structure 340_2. For example, the peripheral circuit spacer structure 340_2 may include a peripheral circuit offset layer 344_2 and a peripheral circuit spacer 345_2. Unlike the peripheral circuit offset layer 344 (see FIG. 4A) of the semiconductor device 1 that may include the first, second, and third peripheral circuit offset layers 341, 342, and 343 (see FIG. 4A), the peripheral circuit offset layer 344_2 of the semiconductor device 2 may include a single layer. In some embodiments of the present inventive concept, the peripheral circuit offset layer 344_2 may include silicon nitride, and the peripheral circuit spacer 345_2 may include silicon oxide.

In some embodiments of the present inventive concept, a thickness of the peripheral circuit offset layer 344_2, which may include of a single layer, in the first horizontal direction (e.g., the X direction) may be less than a thickness of the peripheral circuit offset layer 344, which may include a multi-layer, in the first horizontal direction (e.g., the X direction).

In some embodiments of the present inventive concept, the peripheral circuit offset layer 344_2 may have an I-shaped cross section. For example, the peripheral circuit offset layer 344_2, which may include a single layer, may include a vertical portion extending in the vertical direction (e.g., the Z direction) and might not include a horizontal portion extending in the first horizontal direction (e.g., the X direction). Accordingly, the peripheral circuit spacer 345_2, which is disposed on a sidewall of the peripheral circuit offset layer 344_2, may be in contact with a part of the substrate 110 in the peripheral circuit region 24.

In some embodiments of the present inventive concept, even when the peripheral circuit offset layer 344_2 includes a single layer, the peripheral circuit offset layer 344_2 may include a vertical portion extending in the vertical direction (e.g., the Z direction) and a horizontal portion extending in the first horizontal direction (e.g., the X direction). In this case, the peripheral circuit spacer 345_2 may be disposed on the horizontal portion of the peripheral circuit offset layer 344_2 and may be separated from a part of the substrate 110 in the peripheral circuit region 24 with the horizontal portion of the peripheral circuit offset layer 344_2 disposed therebetween.

Referring to FIG. 6B, the semiconductor device 2A might not include the peripheral circuit top spacer insulating layer 347*a* (see FIG. 6A). In other words, the peripheral circuit first interlayer insulating layer 349 may be formed on an upper surface and a sidewall of the peripheral circuit spacer structure 340_2A. For example, the peripheral circuit first interlayer insulating layer 349 may be in contact with the upper surface and the sidewall of the peripheral circuit spacer structure 340_2A. For example, the peripheral circuit first interlayer insulating layer 349 may be in contact with an upper surface and a sidewall of the peripheral circuit spacer 345_2A.

Figure 7A:
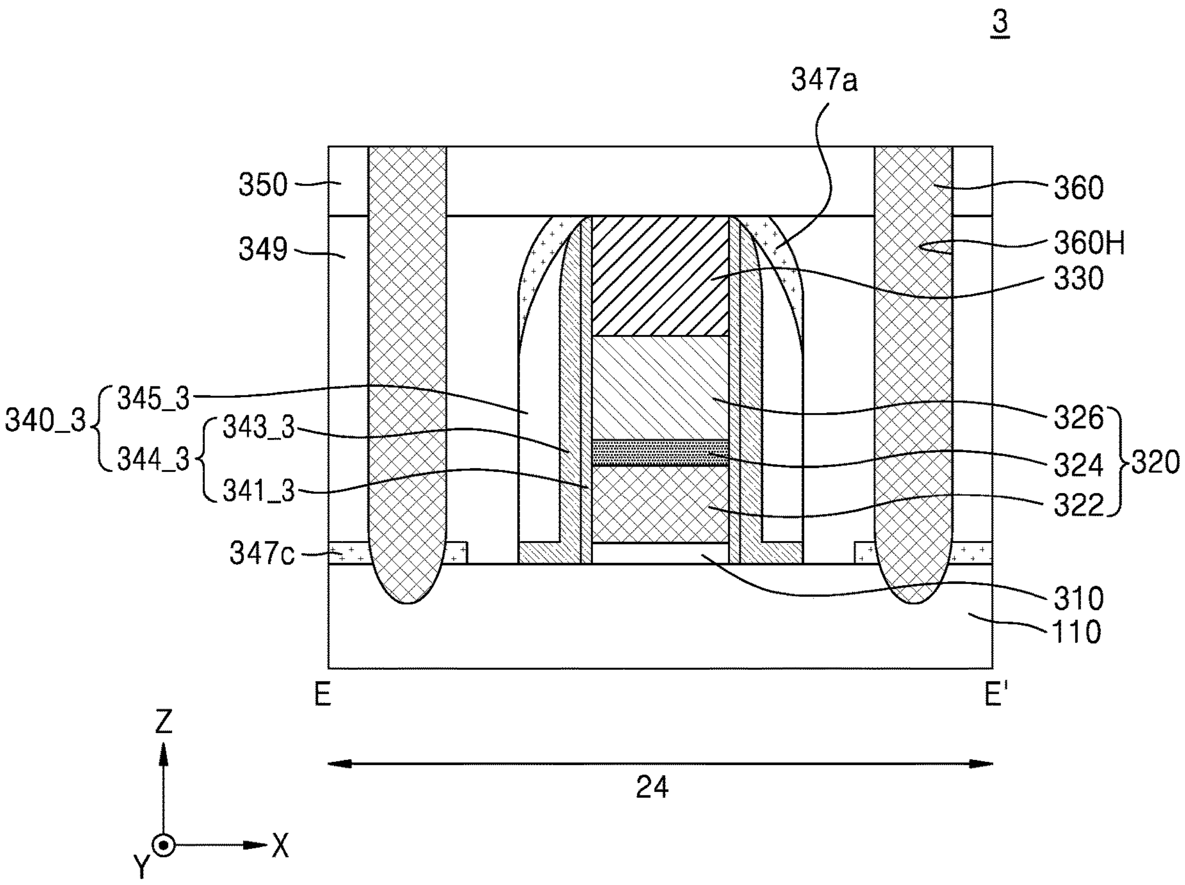
FIGS. 7A and 7B are cross-sectional views of semiconductor devices according to some embodiments of the present inventive concept.
Figure 7B:
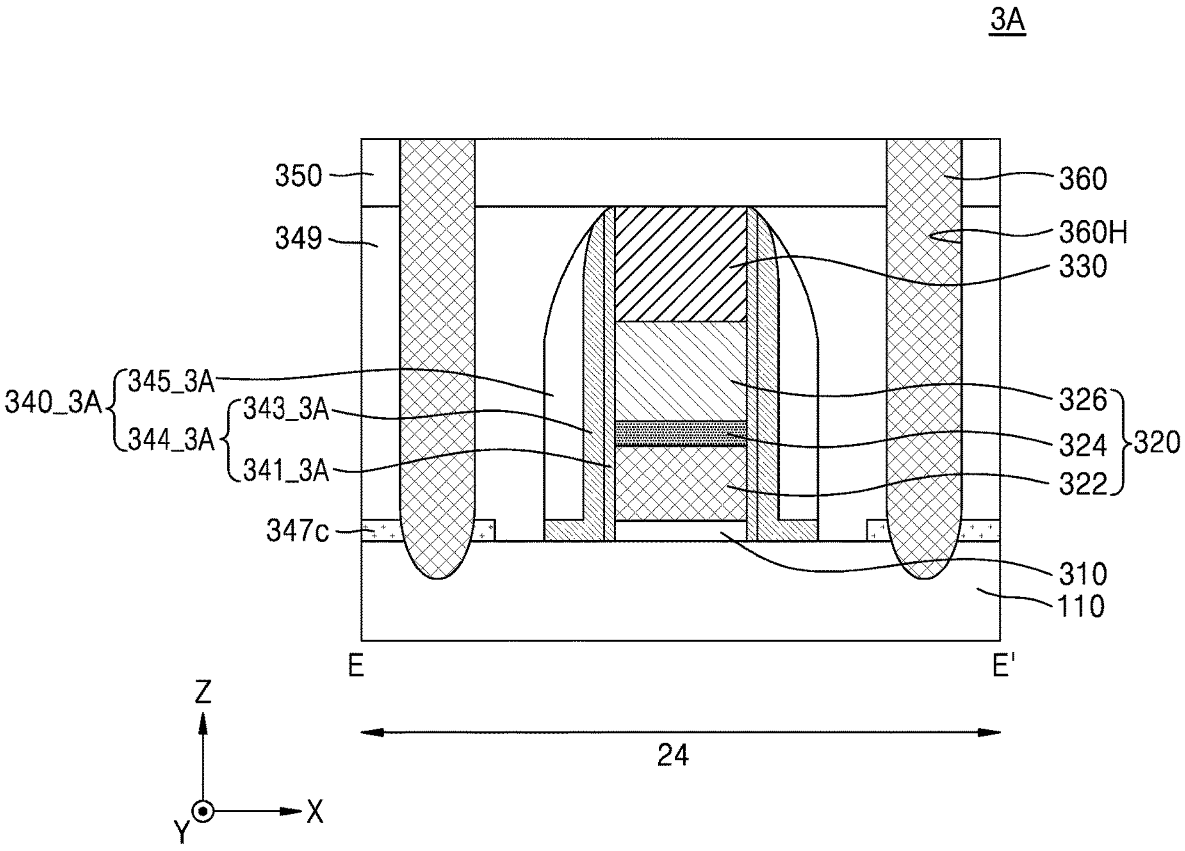

FIGS. 7A and 7B are cross-sectional views of semiconductor devices 3 and 3A according to embodiments of the present inventive concept. Specifically, FIG. 7A is a cross-sectional view illustrating an embodiment of the semiconductor device 1 illustrated in FIG. 4A, and FIG. 7B is a cross-sectional view illustrating an embodiment of the semiconductor device 3 illustrated in FIG. 7A.

Referring to FIG. 7A, the semiconductor device 3 may include a peripheral circuit spacer structure 340_3. For example, the peripheral circuit spacer structure 340_3 may include a peripheral circuit offset layer 344_3 and a peripheral circuit spacer 345_3. Unlike the peripheral circuit offset layer 344 (see FIG. 4A) of the semiconductor device 1 that may include the first, second, and third peripheral circuit offset layers 341, 342, and 343 (see FIG. 4A), the peripheral circuit offset layer 344_3 of the semiconductor device 3 may include a double layer. For example, the peripheral circuit offset layer 344_3 of the semiconductor device 3 may include a first peripheral circuit offset layer 341_3 and a second peripheral circuit offset layer 343_3. In some embodiments of the present inventive concept, the first peripheral circuit offset layer 341_3 may include silicon nitride, and the second peripheral circuit offset layer 343_3 may include silicon nitride. The peripheral circuit spacer 345_3 may include silicon oxide.

In some embodiments of the present inventive concept, the peripheral circuit offset layer 344_3 may have an L-shaped cross section. For example, the peripheral circuit offset layer 344_3 may include a vertical portion extending in the vertical direction (e.g., the Z direction) and a horizontal portion extending in the first horizontal direction (e.g., the X direction). In some embodiments of the present inventive concept, the first peripheral circuit offset layer 341_3 may have an I-shaped cross section or a rectangular shape, and the second peripheral circuit offset layer 343_3 may have an L-shaped cross section. In some embodiments of the present inventive concept, the first peripheral circuit offset layer 341_3 and the second peripheral circuit offset layer 343_3 may each have an L-shaped cross section. In some embodiments of the present inventive concept, the peripheral circuit spacer 345_3 may be disposed on the horizontal portion of the peripheral circuit offset layer 344_3 and may be separated from a part of the substrate 110 in the peripheral circuit region 24 with the horizontal portion of the peripheral circuit offset layer 344_3 disposed therebetween.

In some embodiments of the present inventive concept, the peripheral circuit offset layer 344_3 may have an I-shaped cross section or a rectangular shape. For example, the peripheral circuit offset layer 344_3 may include a vertical portion extending in the vertical direction (e.g., the Z direction) but might not include the horizontal portion extending in the first horizontal direction (e.g., the X direction). Accordingly, the peripheral circuit spacer 345_3 that is disposed on the sidewall of the peripheral circuit offset layer 344_3 may be in contact with a part of the substrate 110 in the peripheral circuit region 24.

Referring to FIG. 7B, the semiconductor device 3A might not include the peripheral circuit top spacer insulating layer 347*a* (see FIG. 7A). In other words, the peripheral circuit first interlayer insulating layer 349 may be formed on an upper surface and a sidewall of a peripheral circuit spacer structure 340_3A. For example, the peripheral circuit first interlayer insulating layer 349 may be in contact with the upper surface and the sidewall of the peripheral circuit spacer structure 340_3A. For example, the peripheral circuit first interlayer insulating layer 349 may be in contact with the upper surface and sidewall of the peripheral circuit spacer 345_3A.

Figure 8A:
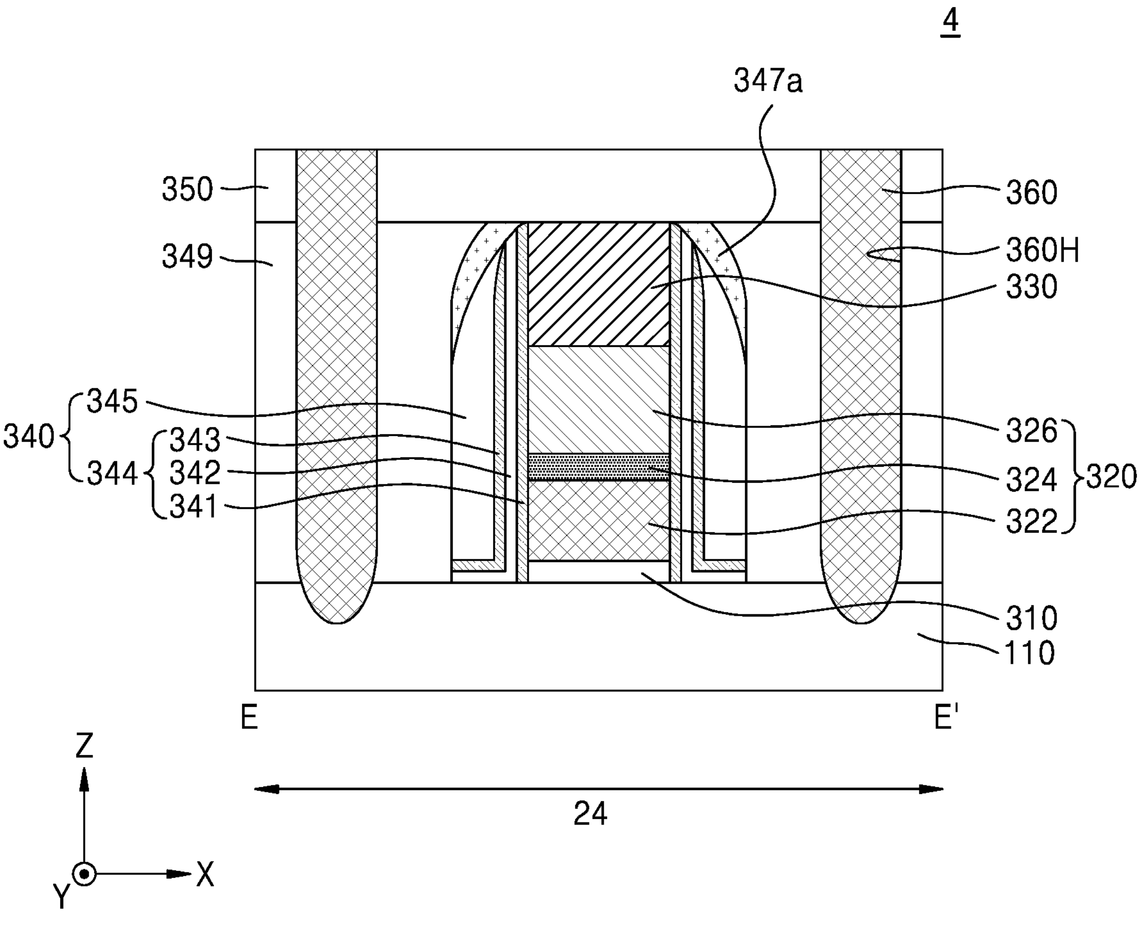
FIGS. 8A and 8B are cross-sectional views of semiconductor devices according to some embodiments of the present inventive concept.
Figure 8B:
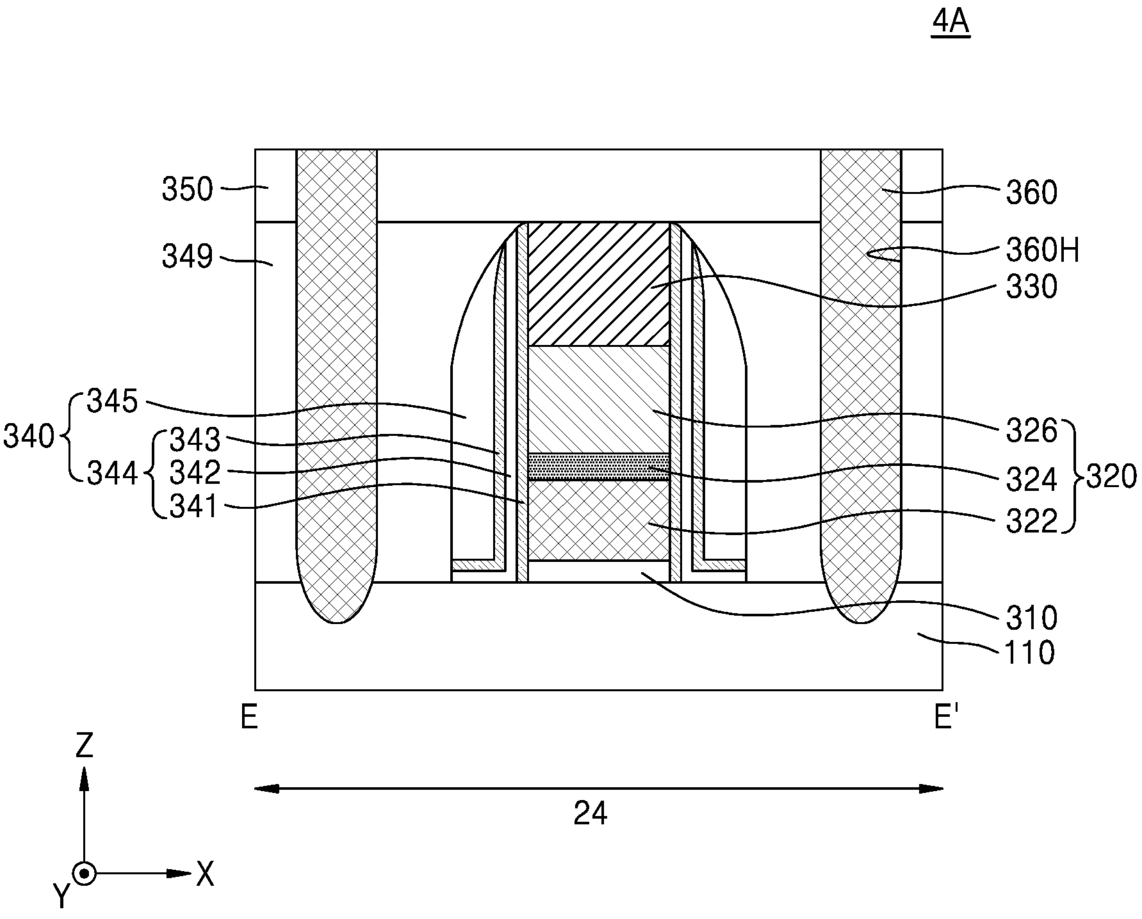

FIGS. 8A and 8B are cross-sectional views of semiconductor devices 4 and 4A according to some embodiments of the present inventive concept. Specifically, FIG. 8A is a cross-sectional view illustrating an embodiment of the semiconductor device 1 illustrated in FIG. 4A, and FIG. 8B is a cross-sectional view illustrating an embodiment of the semiconductor device 4 illustrated in FIG. 8A.

Referring to FIG. 8A, the semiconductor device 4 might not include the peripheral circuit etch stop layer 347*c* (see FIG. 4A). In other words, the peripheral circuit contact 360 may sequentially penetrate the peripheral circuit second insulating interlayer 350 and the peripheral circuit first insulating interlayer 349. The peripheral circuit contact 360 may be connected to a part of the substrate 110 in the peripheral circuit region 24. For example, the peripheral circuit contact hole 360H may be formed by etching the substrate 110 without the peripheral circuit etch stop layer 347*c*.

Referring to FIG. 8B, the semiconductor device 4A might not include the peripheral circuit top spacer insulating layer 347*a* (see FIG. 8A). In other words, the peripheral circuit first interlayer insulating layer 349 may be disposed on an upper surface and a sidewall of the peripheral circuit spacer structure 340. For example, the peripheral circuit first interlayer insulating layer 349 may be in contact with the upper surface and sidewall of the peripheral circuit spacer structure 340. For example, the peripheral circuit first interlayer insulating layer 349 may be in contact with an upper surface and a sidewall of the peripheral circuit spacer 345.

FIGS. 9A to 9E are cross-sectional views illustrating a method of manufacturing the semiconductor device 1, according to an embodiment of the present inventive concept.

Figure 9A:
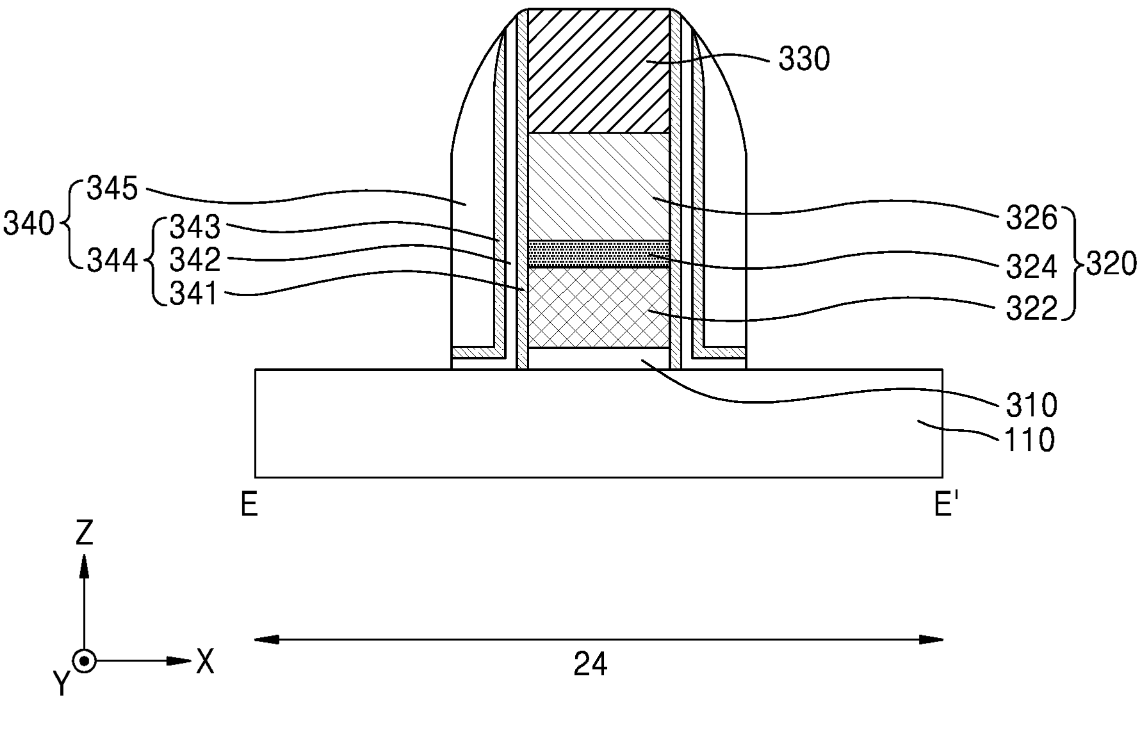
FIGS. 9A, 9B, 9C, 9D, and 9E are cross-sectional views illustrating a method of manufacturing a semiconductor device, according to an embodiment of the present inventive concept.

Referring to FIG. 9A, a peripheral circuit gate structure 320 and a peripheral circuit spacer structure 340 may be formed on a part of a substrate 110 in a peripheral circuit region 24. For example, a peripheral circuit gate insulating layer 310, the peripheral circuit gate structure 320, and a peripheral circuit capping line 330 may be sequentially formed on the substrate 110.

Subsequently, the peripheral circuit spacer structure 340 covering sidewalls of the peripheral circuit gate insulating layer 310, the peripheral circuit gate structure 320, and the peripheral circuit capping line 330 may be formed. For example, first, second, and third peripheral circuit offset layers 341, 342, and 343 and a peripheral circuit spacer 345 may be sequentially formed. In some embodiments of the present inventive concept, the first, second, and third peripheral circuit offset layers 341, 342, and 343 and the peripheral circuit spacer 345 may be formed through a process of forming an insulating layer covering conformally and sequentially on the peripheral circuit gate insulating layer 310, the peripheral circuit gate structure 320, and the peripheral circuit capping line 330 and then removing a part thereof.

Figure 9B:
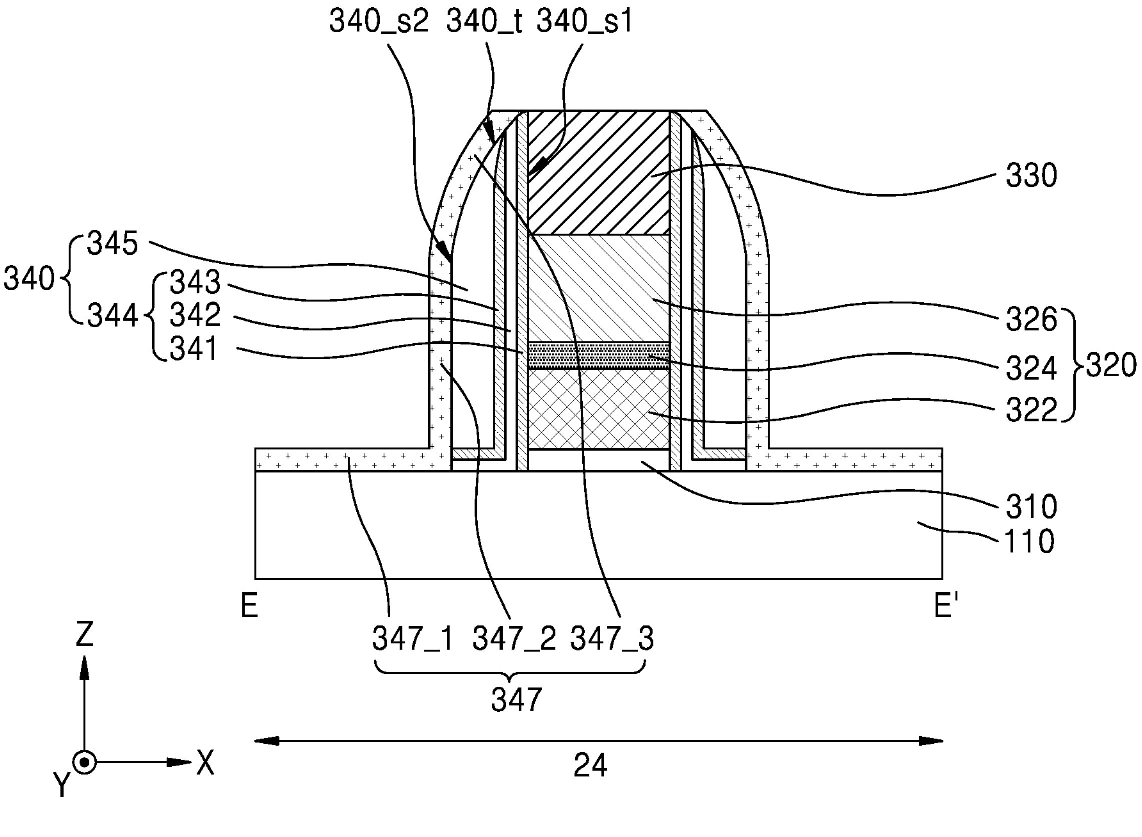

Referring to FIG. 9B, a pre-peripheral circuit etch stop layer 347 conformally covering an upper surface of the substrate 110 and a second sidewall 340_*s*2 and an upper surface 340_*t* of the peripheral circuit spacer structure 340 may be formed. The pre-peripheral circuit etch stop layer 347 may also be formed on an upper surface of the peripheral circuit gate structure 320, that is, an upper surface of the peripheral circuit capping line 330. The pre-peripheral circuit etch stop layer 347 may include, for example, silicon nitride.

In some embodiments of the present inventive concept, the pre-peripheral circuit etch stop layer 347 may include a first portion 347_1, which is on the upper surface of the substrate 110, a second portion 347_2, which is on the second sidewall **340_*s*2 of the peripheral circuit spacer structure 340, and a third portion 347_3, which is on the upper surface 340_*t* of the peripheral circuit spacer structure 340**.

Figure 9C:
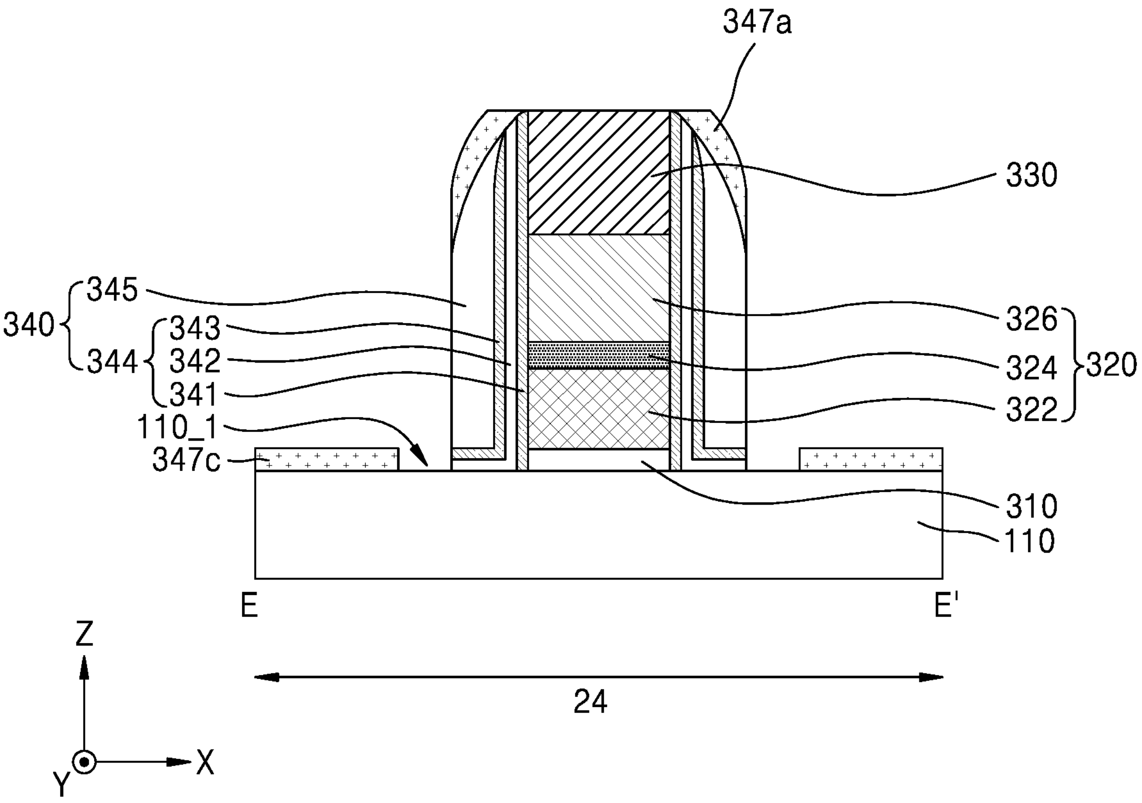

Referring to FIG. 9C, a peripheral circuit top spacer insulating layer **347*a* and a peripheral circuit etch stop layer 347*c* may be formed by removing the second portion 347_2 of the pre-peripheral circuit etch stop layer 347. For example, a mask exposing the second portion 347_2 of the pre-peripheral circuit etch stop layer 347 may be formed, and the exposed second portion 347_2 may be etched. An etch process of the second portion 347_2 of the pre-peripheral circuit etch stop layer 347 may be performed by using a wet etch process or a dry etch process. Accordingly, the second sidewall 340_*s*2 of the peripheral circuit spacer structure 340** may be exposed.

As a result, the first portion 110_1 of the substrate 110, which does not overlap the peripheral circuit etch stop layer **347*c*, the peripheral circuit spacer structure 340, and the peripheral circuit gate structure 320** in the vertical direction (e.g., the Z direction), may be formed.

In some embodiments of the present inventive concept, the peripheral circuit spacer structure 340 might not be removed. For example, during a process of removing the second portion 347_2 of the pre-peripheral circuit etch stop layer 347, the peripheral circuit spacer structure 340 exposed by removing the second portion 347_2 may be partially etched but might not be completely removed.

Figure 9D:
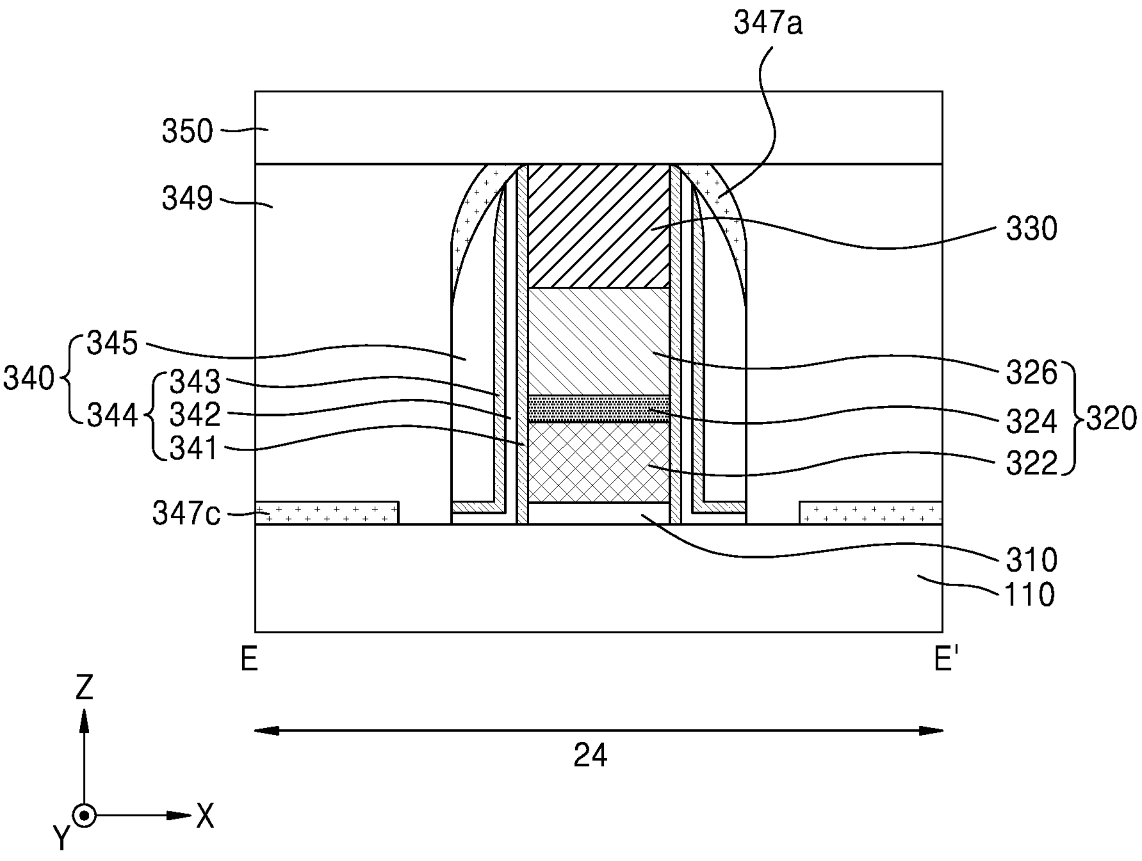

Referring to FIG. 9D, a peripheral circuit first interlayer insulating layer 349 may be formed to at least partially surround the peripheral circuit gate insulating layer 310, the peripheral circuit gate structure 320, the peripheral circuit capping line 330, the peripheral circuit spacer structure 340, and the peripheral circuit top spacer insulating layer **347*a*. Subsequently, a peripheral circuit second insulating interlayer 350 may be formed on the peripheral circuit first insulating interlayer 349**.

As described above, as a result of removing the second portion 347_2 that is on the second sidewall **340_*s*2 of the peripheral circuit spacer structure 340, the peripheral circuit first interlayer insulating layer 349 may be formed on the second sidewall 340_*s*2 of the peripheral circuit spacer structure 340. For example, the peripheral circuit first interlayer insulating layer 349 may be in contact with the second sidewall 340_*s*2 of the peripheral circuit spacer structure 340. For example, the peripheral circuit first interlayer insulating layer 349 may be in contact with the peripheral circuit spacer 345**.

Figure 9E:
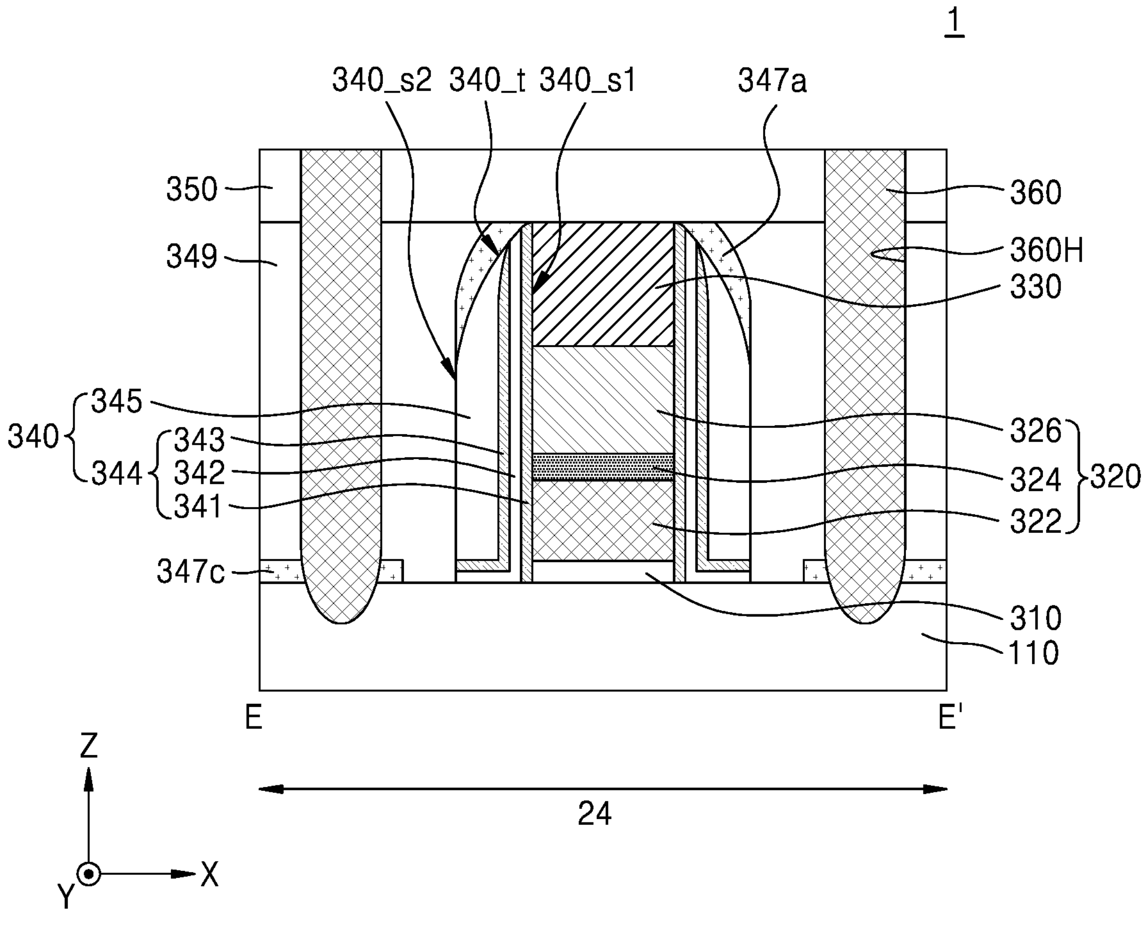

Referring to FIG. 9E, a peripheral circuit contact hole 360H, which sequentially penetrates the peripheral circuit second interlayer insulating layer 350, the peripheral circuit first interlayer insulating layer 349, and the peripheral circuit etch stop layer **347*c*, may be formed. A peripheral circuit contact 360 may be formed in the peripheral circuit contact hole 360**H.

In some embodiments of the present inventive concept, the peripheral circuit etch stop layer **347*c* may be disposed on the substrate 110 to adjust a degree of etch of the substrate 110 during formation of the peripheral circuit contact hole 360H. For example, the peripheral circuit etch stop layer 347*c* may be formed on the substrate 110 to prevent the substrate 110 from being excessively etched during the formation of the peripheral circuit contact hole 360**H.

Referring to FIGS. 9A to 9E, the semiconductor device 1 may be manufactured by removing the second portion 347_2 of the pre-peripheral circuit etch stop layer 347. As described above, the pre-peripheral circuit etch stop layer 347 may include, for example, silicon nitride, and parasitic capacitance of the peripheral circuit element PTR may be reduced by partially removing the pre-peripheral circuit etch stop layer 347. For example, according to embodiments of the present inventive concept, the semiconductor device 1 with increased performance and reliability may be provided.

In some embodiments of the present inventive concept, the semiconductor device 1A described with reference to FIG. 4B may be manufactured by partially leaving the second portion 347_2 of the pre-peripheral circuit etch stop layer 347 without completely removing the second portion 347_2.

In some embodiments of the present inventive concept, the semiconductor device 1B described with reference to FIG. 5 may be manufactured by removing the first portion 347_1 with the second portion 347_2 during the process of removing the second portion 347_2 of the pre-peripheral circuit etch stop layer 347.

While the present inventive concept has been described with reference to example embodiments thereof, it will be understood by those of ordinary skill in the art that various changes in form and details may be made thereto without departing from the spirit and scope of the present inventive concept.

What is claimed is:

1. A semiconductor device comprising:

a substrate including a cell region and a peripheral circuit region;

an active region defined by a device isolation layer in the substrate in the cell region;

a cell word line extending across the active region in a first horizontal direction within the substrate in the cell region;

a cell bit line extending in a second horizontal direction crossing the first horizontal direction on the substrate in the cell region;

a peripheral circuit gate structure extending in the second horizontal direction on the substrate in the peripheral circuit region;

a peripheral circuit spacer structure disposed on a sidewall of the peripheral circuit gate structure;

a peripheral circuit etch stop layer disposed on the substrate in the peripheral circuit region, and separated from the peripheral circuit gate structure and the peripheral circuit spacer structure; and a peripheral circuit contact connected to the peripheral circuit region of the substrate by penetrating the peripheral circuit etch stop layer in a vertical direction, wherein the peripheral circuit spacer structure includes nitride, and the peripheral circuit etch stop layer has an end portion positioned between the peripheral circuit contact and the peripheral circuit spacer structure.

2. The semiconductor device of claim 1, wherein the peripheral circuit etch stop layer includes nitride, and in the peripheral circuit region, the substrate includes a first portion that does not overlap the peripheral circuit etch stop layer, the peripheral circuit spacer structure, and the peripheral circuit gate structure in the vertical direction.

3. The semiconductor device of claim 1, further comprising:

a peripheral circuit top spacer insulating layer conformally covering an upper surface of the peripheral circuit spacer structure, wherein, in the peripheral circuit region, the substrate includes a first portion that does not overlap the peripheral circuit etch stop layer, the peripheral circuit spacer structure, and the peripheral circuit gate structure in the vertical direction, and the peripheral circuit top spacer insulating layer does not overlap the first portion in the vertical direction.

4. The semiconductor device of claim 3, wherein a sidewall of the peripheral circuit spacer structure includes at least a part that does not overlap the peripheral circuit top spacer insulating layer in the first horizontal direction.

5. The semiconductor device of claim 1, wherein the peripheral circuit spacer structure comprises:

a peripheral circuit offset layer arranged on the sidewall of the peripheral circuit gate structure and including nitride; and a peripheral circuit spacer separated from the peripheral circuit gate structure with the peripheral circuit offset layer disposed between the peripheral circuit spacer and the peripheral circuit gate structure and including oxide.

6. The semiconductor device of claim 5, wherein the peripheral circuit offset layer includes a multi-layer, wherein each layer of the multi-layer includes one of nitride or oxide.

7. The semiconductor device of claim 5, further comprising:

a peripheral circuit interlayer insulating layer at least partially surrounding the peripheral circuit gate structure and the peripheral circuit spacer structure and including oxide, wherein the peripheral circuit interlayer insulating layer is in contact with the peripheral circuit spacer.

8. A semiconductor device comprising:

a substrate including a cell region and a peripheral circuit region;

an active region defined by a device isolation layer in the substrate in the cell region;

a cell word line extending across the active region in a first horizontal direction within the substrate in the cell region;

a cell bit line extending in a second horizontal direction crossing the first horizontal direction on the substrate in the cell region;

a peripheral circuit gate structure extending in the second horizontal direction on the substrate in the peripheral circuit region;

a peripheral circuit offset layer arranged on a sidewall of the peripheral circuit gate structure and including nitride;

a peripheral circuit etch stop layer arranged on the substrate in the peripheral circuit region, and separated from the peripheral circuit offset layer with a peripheral circuit interlayer insulating layer disposed between the peripheral circuit etch stop layer and the peripheral circuit offset layer, wherein the peripheral circuit etch stop layer includes nitride; and a peripheral circuit contact connected to the peripheral circuit region of the substrate by penetrating the peripheral circuit interlayer insulating layer and the peripheral circuit etch stop layer in a vertical direction.

9. The semiconductor device of claim 8, wherein the peripheral circuit interlayer insulating layer includes a material that is different from a material of the peripheral circuit etch stop layer.

10. The semiconductor device of claim 8, further comprising:

a peripheral circuit spacer arranged on a sidewall of the peripheral circuit offset layer and separated from the peripheral circuit gate structure with the peripheral circuit offset layer disposed between peripheral circuit spacer and the peripheral circuit gate structure, wherein the peripheral circuit spacer is in contact with the peripheral circuit interlayer insulating layer.

11. The semiconductor device of claim 8, further comprising:

a peripheral circuit top spacer insulating layer arranged on an upper surface of the peripheral circuit offset layer and including nitride, wherein a sidewall of the peripheral circuit offset layer includes a portion that does not overlap with the peripheral circuit top spacer insulating layer in the first horizontal direction.

12. The semiconductor device of claim 11, wherein the peripheral circuit offset layer has an L-shaped cross section, and a length of the peripheral circuit top spacer insulating layer in the first horizontal direction is less than or equal to a length of the peripheral circuit offset layer in the first horizontal direction.

13. The semiconductor device of claim 8, wherein the peripheral circuit offset layer includes:

a first peripheral circuit offset layer arranged on the sidewall of the peripheral circuit gate structure and including nitride; and a second peripheral circuit offset layer arranged on the first peripheral circuit offset layer and including oxide.

14. The semiconductor device of claim 13, wherein the peripheral circuit offset layer further includes a third peripheral circuit offset layer arranged on the second peripheral circuit offset layer and including nitride.

15. The semiconductor device of claim 8, further comprising:

a peripheral circuit spacer arranged on a sidewall of the peripheral circuit offset layer and separated from the peripheral circuit gate structure with the peripheral circuit offset layer disposed between peripheral circuit spacer and the peripheral circuit gate structure, wherein the peripheral circuit etch stop layer has an end portion positioned between the peripheral circuit contact and the peripheral circuit spacer.

16. A semiconductor device comprising:

a substrate including a first region and a second region;

an active region defined by a device isolation layer in the substrate in the first region;

a cell word line extending across the active region in a first horizontal direction within the substrate in the first region;

a cell bit line extending in a second horizontal direction crossing the first horizontal direction on the substrate in the first region;

a peripheral circuit gate structure extending in the second horizontal direction on the substrate in the second region;

a peripheral circuit spacer structure arranged on a sidewall of the peripheral circuit gate structure and including a peripheral circuit offset layer, which includes silicon nitride, and a peripheral circuit spacer that is separated from the peripheral circuit gate structure with the peripheral circuit offset layer disposed between peripheral circuit spacer and the peripheral circuit gate structure and includes silicon oxide;

a peripheral circuit etch stop layer arranged on the substrate in the second region, and separated from the peripheral circuit offset layer with a peripheral circuit interlayer insulating layer disposed between the peripheral circuit etch stop layer and the peripheral circuit offset layer, wherein the peripheral circuit etch stop layer includes silicon nitride;

a peripheral circuit contact connected to the substrate in the second region by penetrating the peripheral circuit interlayer insulating layer and the peripheral circuit etch stop layer in a vertical direction; and a peripheral circuit top spacer insulating layer arranged on an upper surface of the peripheral circuit offset layer and including nitride, wherein a side surface of the peripheral circuit offset layer includes a portion that does not overlap with the peripheral circuit top spacer insulating layer in the first horizontal direction.

17. The semiconductor device of claim 16, wherein the substrate in the second region includes a first portion positioned between the peripheral circuit etch stop layer and the peripheral circuit spacer structure adjacent to the peripheral circuit etch stop layer, wherein the first portion of the substrate does not overlap with the peripheral circuit etch stop layer and the peripheral circuit spacer structure adjacent to the peripheral circuit etch stop layer in the vertical direction.

18. The semiconductor device of claim 17, wherein the peripheral circuit top spacer insulating layer does not overlap the first portion of the substrate in the vertical direction.

19. The semiconductor device of claim 16, wherein the peripheral circuit offset layer includes:

a first peripheral circuit offset layer arranged on the sidewall of the peripheral circuit gate structure and including nitride;

a second peripheral circuit offset layer arranged on the first peripheral circuit offset layer and including oxide; and a third peripheral circuit offset layer arranged on the second peripheral circuit offset layer and including nitride.

20. The semiconductor device of claim 16, wherein the peripheral circuit spacer is in contact with the peripheral circuit interlayer insulating layer.

* * * * *